(12) United States Patent
Weingarten

(10) Patent No.: US 8,730,729 B2
(45) Date of Patent: May 20, 2014

(54) SYSTEMS AND METHODS FOR AVERAGING ERROR RATES IN NON-VOLATILE DEVICES AND STORAGE SYSTEMS

(75) Inventor: Hanan Weingarten, Herzelia (IL)

(73) Assignee: Densbits Technologies Ltd., Haifa (IL)

( * ) Notice: Subject to any disclaimer, the term of this patent is extended or adjusted under 35 U.S.C. 154(b) by 0 days.

(21) Appl. No.: 13/301,308

(22) Filed: Nov. 21, 2011

(65) Prior Publication Data

US 2012/0066441 A1   Mar. 15, 2012

Related U.S. Application Data

(62) Division of application No. 12/595,964, filed on Oct. 15, 2009, now Pat. No. 8,427,867.

(51) Int. Cl.
*G11C 11/34* (2006.01)
*G11C 16/04* (2006.01)
*H04L 1/20* (2006.01)

(52) U.S. Cl.
CPC .......... *G11C 16/0483* (2013.01); *H04L 1/203* (2013.01)
USPC ...................................... 365/185.12; 714/704

(58) Field of Classification Search
USPC ........................................ 365/185.01–185.33
See application file for complete search history.

(56) References Cited

U.S. PATENT DOCUMENTS

| | | |
|---|---|---|
| 4,430,701 A | 2/1984 | Christian et al. |
| 4,463,375 A | 7/1984 | Macovski |
| 4,584,686 A | 4/1986 | Fritze |
| 4,589,084 A | 5/1986 | Fling et al. |
| 4,777,589 A | 10/1988 | Boettner et al. |
| 4,866,716 A | 9/1989 | Weng |
| 5,003,597 A | 3/1991 | Merkle |
| 5,077,737 A | 12/1991 | Leger et al. |
| 5,297,153 A | 3/1994 | Baggen et al. |
| 5,305,276 A | 4/1994 | Uenoyama |
| 5,592,641 A | 1/1997 | Doyle et al. |
| 5,623,620 A | 4/1997 | Alexis et al. |
| 5,640,529 A | 6/1997 | Hasbun |
| 5,657,332 A | 8/1997 | Auclair et al. |
| 5,663,901 A | 9/1997 | Eliyahou et al. |
| 5,724,538 A | 3/1998 | Bryg et al. |
| 5,729,490 A | 3/1998 | Calligaro et al. |
| 5,740,395 A | 4/1998 | Hasbun et al. |
| 5,745,418 A | 4/1998 | Hu et al. |

(Continued)

OTHER PUBLICATIONS

Search Report of PCT Patent Application WO 2009/118720 A3.

(Continued)

*Primary Examiner* — Kretelia Graham
(74) *Attorney, Agent, or Firm* — Dentons US LLP

(57) ABSTRACT

A system for storing a plurality of logical pages in a set of at least one flash device, each flash device including a set of at least one erase block, the system comprising apparatus for distributing at least one of the plurality of logical pages over substantially all of the erase blocks in substantially all of the flash devices, thereby to define, for at least one logical page, a sequence of pagelets thereof together including all information on the logical page and each being stored within a different erase block in the set of erase blocks; and apparatus for reading each individual page from among the plurality of logical pages including apparatus for calling and ordering the sequence of pagelets from different erase blocks in the set of erase blocks.

3 Claims, 14 Drawing Sheets

(56) References Cited

U.S. PATENT DOCUMENTS

| | | |
|---|---|---|
| 5,778,430 A | 7/1998 | Giovannetti et al. |
| 5,793,774 A | 8/1998 | Usui et al. |
| 5,920,578 A | 7/1999 | Zook et al. |
| 5,926,409 A | 7/1999 | Engh et al. |
| 5,933,368 A | 8/1999 | Hu et al. |
| 5,956,268 A | 9/1999 | Lee |
| 5,956,473 A | 9/1999 | Hu et al. |
| 5,968,198 A | 10/1999 | Hassan et al. |
| 5,982,659 A | 11/1999 | Irrinki et al. |
| 6,011,741 A | 1/2000 | Eliyahou et al. |
| 6,016,275 A | 1/2000 | Han |
| 6,038,634 A | 3/2000 | Ji et al. |
| 6,081,878 A | 6/2000 | Estakhri et al. |
| 6,094,465 A | 7/2000 | Stein et al. |
| 6,119,245 A | 9/2000 | Hiratsuka |
| 6,182,261 B1 | 1/2001 | Haller et al. |
| 6,192,497 B1 | 2/2001 | Yang et al. |
| 6,195,287 B1 | 2/2001 | Hirano |
| 6,199,188 B1 | 3/2001 | Shen et al. |
| 6,209,114 B1 | 3/2001 | Wolf et al. |
| 6,259,627 B1 | 7/2001 | Wong |
| 6,272,052 B1 | 8/2001 | Miyauchi |
| 6,278,633 B1 | 8/2001 | Wong et al. |
| 6,279,133 B1 | 8/2001 | Vafai et al. |
| 6,301,151 B1 | 10/2001 | Engh et al. |
| 6,370,061 B1 | 4/2002 | Yachareni et al. |
| 6,374,383 B1 | 4/2002 | Weng |
| 6,504,891 B1 | 1/2003 | Chevallier |
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,637,002 B1 | 10/2003 | Weng et al. |
| 6,639,865 B2 | 10/2003 | Kwon |
| 6,674,665 B1 | 1/2004 | Mann et al. |
| 6,675,281 B1 | 1/2004 | Oh et al. |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,968,421 B2 * | 11/2005 | Conley ............... 711/103 |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,149,950 B2 | 12/2006 | Spencer et al. |
| 7,177,977 B2 | 2/2007 | Chen et al. |
| 7,188,228 B1 * | 3/2007 | Chang et al. ............ 711/202 |
| 7,191,379 B2 | 3/2007 | Adelmann et al. |
| 7,196,946 B2 | 3/2007 | Chen et al. |
| 7,203,874 B2 | 4/2007 | Roohparvar |
| 7,212,426 B2 | 5/2007 | Park et al. |
| 7,290,203 B2 | 10/2007 | Emma et al. |
| 7,292,365 B2 | 11/2007 | Knox |
| 7,301,928 B2 | 11/2007 | Nakabayashi et al. |
| 7,315,916 B2 | 1/2008 | Bennett et al. |
| 7,388,781 B2 | 6/2008 | Litsyn et al. |
| 7,395,404 B2 * | 7/2008 | Gorobets et al. ............ 711/201 |
| 7,441,067 B2 | 10/2008 | Gorobets et al. |
| 7,443,729 B2 | 10/2008 | Li et al. |
| 7,450,425 B2 | 11/2008 | Aritome |
| 7,454,670 B2 | 11/2008 | Kim et al. |
| 7,466,575 B2 | 12/2008 | Shalvi et al. |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,610,433 B2 | 10/2009 | Randell et al. |
| 7,613,043 B2 | 11/2009 | Cornwell et al. |
| 7,619,922 B2 | 11/2009 | Li et al. |
| 7,697,326 B2 | 4/2010 | Sommer et al. |
| 7,706,182 B2 | 4/2010 | Shalvi et al. |
| 7,716,538 B2 | 5/2010 | Gonzalez et al. |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,911,848 B2 | 3/2011 | Eun et al. |
| 7,961,797 B1 | 6/2011 | Yang et al. |
| 7,975,192 B2 | 7/2011 | Sommer et al. |
| 8,020,073 B2 | 9/2011 | Emma et al. |
| 8,108,590 B2 | 1/2012 | Chow et al. |
| 8,122,328 B2 | 2/2012 | Liu et al. |
| 8,159,881 B2 | 4/2012 | Yang |
| 8,190,961 B1 | 5/2012 | Yang et al. |
| 8,250,324 B2 | 8/2012 | Haas et al. |
| 8,300,823 B2 | 10/2012 | Bojinov et al. |
| 8,305,812 B2 | 11/2012 | Levy et al. |
| 8,327,246 B2 | 12/2012 | Weingarten et al. |
| 8,407,560 B2 | 3/2013 | Ordentlich et al. |
| 8,417,893 B2 | 4/2013 | Khmelnitsky et al. |
| 2001/0034815 A1 | 10/2001 | Dugan et al. |
| 2002/0063774 A1 | 5/2002 | Hillis et al. |
| 2002/0085419 A1 | 7/2002 | Kwon et al. |
| 2002/0154769 A1 | 10/2002 | Petersen et al. |
| 2002/0156988 A1 | 10/2002 | Toyama et al. |
| 2002/0174156 A1 | 11/2002 | Birru et al. |
| 2003/0014582 A1 | 1/2003 | Nakanishi |
| 2003/0065876 A1 | 4/2003 | Lasser |
| 2003/0101404 A1 | 5/2003 | Zhao et al. |
| 2003/0105620 A1 | 6/2003 | Bowen |
| 2003/0177300 A1 | 9/2003 | Lee et al. |
| 2003/0192007 A1 | 10/2003 | Miller et al. |
| 2004/0015771 A1 | 1/2004 | Lasser et al. |
| 2004/0030971 A1 | 2/2004 | Tanaka et al. |
| 2004/0059768 A1 | 3/2004 | Denk et al. |
| 2004/0080985 A1 | 4/2004 | Chang et al. |
| 2004/0153722 A1 | 8/2004 | Lee |
| 2004/0153817 A1 | 8/2004 | Norman et al. |
| 2004/0181735 A1 | 9/2004 | Xin |
| 2004/0203591 A1 | 10/2004 | Lee |
| 2004/0210706 A1 | 10/2004 | In et al. |
| 2005/0013165 A1 | 1/2005 | Ban |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le-Bars et al. |
| 2005/0144213 A1 | 6/2005 | Simkins et al. |
| 2005/0144368 A1 | 6/2005 | Chung et al. |
| 2005/0169057 A1 | 8/2005 | Shibata et al. |
| 2005/0172179 A1 | 8/2005 | Brandenberger et al. |
| 2005/0213393 A1 | 9/2005 | Lasser |
| 2005/0243626 A1 | 11/2005 | Ronen |
| 2006/0059406 A1 | 3/2006 | Micheloni et al. |
| 2006/0059409 A1 | 3/2006 | Lee |
| 2006/0064537 A1 | 3/2006 | Oshima |
| 2006/0101193 A1 | 5/2006 | Murin |
| 2006/0195651 A1 | 8/2006 | Estakhri et al. |
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |
| 2006/0282411 A1 | 12/2006 | Fagin et al. |
| 2006/0284244 A1 | 12/2006 | Forbes et al. |
| 2006/0294312 A1 | 12/2006 | Walmsley |
| 2007/0025157 A1 | 2/2007 | Wan et al. |
| 2007/0063180 A1 | 3/2007 | Asano et al. |
| 2007/0081388 A1 | 4/2007 | Joo |
| 2007/0098069 A1 | 5/2007 | Gordon |
| 2007/0103992 A1 * | 5/2007 | Sakui et al. ............ 365/185.33 |
| 2007/0104004 A1 | 5/2007 | So et al. |
| 2007/0109858 A1 | 5/2007 | Conley et al. |

(56) References Cited

U.S. PATENT DOCUMENTS

| | | |
|---|---|---|
| 2007/0124652 A1 | 5/2007 | Litsyn et al. |
| 2007/0140006 A1 | 6/2007 | Chen et al. |
| 2007/0143561 A1 | 6/2007 | Gorobets |
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata et al. |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2007/0297226 A1 | 12/2007 | Mokhlesi |
| 2008/0010581 A1 | 1/2008 | Alrod et al. |
| 2008/0028014 A1 | 1/2008 | Hilt et al. |
| 2008/0049497 A1 | 2/2008 | Mo |
| 2008/0055989 A1 | 3/2008 | Lee et al. |
| 2008/0082897 A1 | 4/2008 | Brandman et al. |
| 2008/0092026 A1 | 4/2008 | Brandman et al. |
| 2008/0104309 A1* | 5/2008 | Cheon et al. ............... 711/103 |
| 2008/0112238 A1 | 5/2008 | Kim et al. |
| 2008/0116509 A1 | 5/2008 | Harari et al. |
| 2008/0126686 A1 | 5/2008 | Sokolov et al. |
| 2008/0127104 A1 | 5/2008 | Li et al. |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0137414 A1 | 6/2008 | Park et al. |
| 2008/0141043 A1 | 6/2008 | Flynn et al. |
| 2008/0148115 A1 | 6/2008 | Sokolov et al. |
| 2008/0158958 A1 | 7/2008 | Shalvi et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0201620 A1 | 8/2008 | Gollub |
| 2008/0209114 A1 | 8/2008 | Chow et al. |
| 2008/0219050 A1 | 9/2008 | Shalvi et al. |
| 2008/0225599 A1 | 9/2008 | Chae |
| 2008/0250195 A1 | 10/2008 | Chow et al. |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0027961 A1 | 1/2009 | Park et al. |
| 2009/0043951 A1 | 2/2009 | Shalvi et al. |
| 2009/0046507 A1 | 2/2009 | Aritome |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1 | 5/2009 | Flynn et al. |
| 2009/0132755 A1 | 5/2009 | Radke |
| 2009/0144598 A1 | 6/2009 | Yoon et al. |
| 2009/0144600 A1 | 6/2009 | Perlmutter et al. |
| 2009/0150599 A1 | 6/2009 | Bennett |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2009/0282185 A1 | 11/2009 | Van Cauwenbergh |
| 2009/0282186 A1 | 11/2009 | Mokhlesi et al. |
| 2009/0287930 A1 | 11/2009 | Nagaraja |
| 2009/0300269 A1 | 12/2009 | Radke et al. |
| 2009/0323942 A1 | 12/2009 | Sharon et al. |
| 2010/0005270 A1 | 1/2010 | Jiang |
| 2010/0025811 A1 | 2/2010 | Bronner et al. |
| 2010/0030944 A1 | 2/2010 | Hinz |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0172179 A1 | 7/2010 | Gorobets et al. |
| 2010/0174853 A1 | 7/2010 | Lee et al. |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0241793 A1 | 9/2010 | Sugimoto et al. |
| 2010/0246265 A1 | 9/2010 | Moschiano et al. |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0269008 A1 | 10/2010 | Leggette et al. |
| 2010/0293321 A1 | 11/2010 | Weingarten |
| 2010/0318724 A1 | 12/2010 | Yeh |
| 2011/0051521 A1 | 3/2011 | Levy et al. |
| 2011/0055461 A1 | 3/2011 | Steiner et al. |
| 2011/0093650 A1 | 4/2011 | Kwon et al. |
| 2011/0096612 A1 | 4/2011 | Steiner et al. |
| 2011/0099460 A1 | 4/2011 | Dusija et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0194353 A1 | 8/2011 | Hwang et al. |
| 2011/0209028 A1 | 8/2011 | Post et al. |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |
| 2012/0008414 A1 | 1/2012 | Katz et al. |
| 2012/0017136 A1 | 1/2012 | Ordentlich et al. |
| 2012/0051144 A1 | 3/2012 | Weingarten et al. |
| 2012/0063227 A1 | 3/2012 | Weingarten et al. |
| 2012/0066441 A1 | 3/2012 | Weingarten |
| 2012/0110250 A1 | 5/2012 | Sabbag et al. |
| 2012/0124273 A1 | 5/2012 | Goss et al. |
| 2012/0246391 A1 | 9/2012 | Meir et al. |

OTHER PUBLICATIONS

Search Report of PCT Patent Application WO 2009/095902 A3.
Search Report of PCT Patent Application WO 2009/078006 A3.
Search Report of PCT Patent Application WO 2009/074979 A3.

(56) References Cited

OTHER PUBLICATIONS

Search Report of PCT Patent Application WO 2009/074978 A3.
Search Report of PCT Patent Application WO 2009/072105 A3.
Search Report of PCT Patent Application WO 2009/072104 A3.
Search Report of PCT Patent Application WO 2009/072103 A3.
Search Report of PCT Patent Application WO 2009/072102 A3.
Search Report of PCT Patent Application WO 2009/072101 A3.
Search Report of PCT Patent Application WO 2009/072100 A3.
Search Report of PCT Patent Application WO 2009/053963 A3.
Search Report of PCT Patent Application WO 2009/053962 A3.
Search Report of PCT Patent Application WO 2009/053961 A3.
Search Report of PCT Patent Application WO 2009/037697 A3.
Yani Chen, Keshab K. Parhi, "Small Area Parallel Chien Search Architectures for Long BCH Codes", Ieee Transactions on Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, pp. II-369-II-372 vol. 2.
Michael Purser, "Introduction to Error Correcting Codes", Artech House Inc., 1995.
Ron M. Roth, "Introduction to Coding Theory", Cambridge University Press, 2006.
Akash Kumar, Sergei Sawitzki, "High-Throughput and Low Power Architectures for Reed Solomon Decoder", (a.kumar at tue.nl, Eindhoven University of Technology and sergei.sawitzki at philips.com).
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-off Programming Speed and Current Absorption in Flash Memories with the Ramped-Gate Programming Technique", Ieee Transactions on Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built in Self Diagnosis", ITC International Test Conference, Paper 2.1.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, "Data retention prediction for modern floating gate non-volatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com.
Paulo Cappelletti, Clara Golla, Piero Olivo, Enrico Zanoni, "Flash Memories", Kluwer Academic Publishers, 1999.
JEDEC Standard, "Stress-Test-Driven Qualification of Integrated Circuits", JEDEC Solid State Technology Association. JEDEC Standard No. 47F pp. 1-26.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.

\* cited by examiner

| Virtual address | Block# | Page Usage Vector |
|---|---|---|
| 0 | 10 | 1111101111.. |
| 256 | 5 | 1101101111.. |
| 512 | 1 | 1111111111.. |
| 768 | 2 | 0001111111.. |

Figure 9

| Erase Block | Free |
|---|---|
| 0 | No |
| 1 | No |
| 2 | No |
| 3 | Yes |

Figure 10

| Virtual address | Block# | Page Usage Vector | Short/long Vector |
|---|---|---|---|
| 0 | 10 | 1111101111.. | 1111001111.. |
| 256 | 5 | 1101101111.. | 1100001111.. |
| 512 | 1 | 1111111111.. | 1111111111.. |
| 768 | 2 | 0001111111.. | 0000111111.. |

Figure 11

SYSTEMS AND METHODS FOR AVERAGING ERROR RATES IN NON-VOLATILE DEVICES AND STORAGE SYSTEMS

REFERENCE TO CO-PENDING APPLICATIONS

This application is a DIVISIONAL of, claims priority to and incorporates by reference U.S. patent application Ser. No. 12/595,964, filed Oct. 15, 2009, which is a NONPROVISIONAL of, claims priority to and incorporates by reference U.S. Provisional Application No. 60/960,943, filed Oct. 22, 2007 and entitled "Systems and Methods to Reduce Errors in Solid State Disks and Large Flash Devices" and U.S. Provisional Application No. 61/071,469, filed Apr. 30, 2008 and entitled "Systems and Methods for Averaging Error Rates in Non-Volatile Devices and Storage Systems" which is a 371 of PCT International Application No. PCT/IL2008/01238 entitled "Systems and Methods for Averaging Error Rates in Non-Volatile Devices and Storage Systems, file Sep. 17, 2008.

Other co-pending applications include: U.S. Provisional Application No. 60/960,207, filed Sep. 20, 2007 and entitled "Systems and Methods for Coupling Detection in Flash Memory", U.S. Provisional Application No. 61/071,467, filed Apr. 30, 2008 and entitled "Improved Systems and Methods for Determining Logical Values of Coupled Flash Memory Cells", U.S. Provisional Application No. 60/996,027, filed Oct. 25, 2007 and entitled "Systems and Methods for Coping with Variable Bit Error Rates in Flash Devices", U.S. Provisional Application No. 61/071,466, filed Apr. 30, 2008 and entitled "Systems and Methods for Multiple Coding Rates in Flash Devices", U.S. Provisional Application No. 61/006,120, filed Dec. 19, 2007 and entitled "Systems and Methods for Coping with Multi Stage Decoding in Flash Devices", U.S. Provisional Application No. 61/071,464, filed Apr. 30, 2008 and entitled "A Decoder Operative to Effect A Plurality of Decoding Stages Upon Flash Memory Data and Methods Useful in Conjunction Therewith", U.S. Provisional Application No. 61/006,385, filed Jan. 10, 2008 and entitled "A System for Error Correction Encoder and Decoder Using the Lee Metric and Adapted to Work on Multi-Level Physical Media", U.S. Provisional Application No. 61/064,995, filed Apr. 8, 2008 and entitled "Systems and Methods for Error Correction and Decoding on Multi-Level Physical Media", U.S. Provisional Application No. 60/996,948, filed Dec. 12, 2007 and entitled "Low Power BCH/RS Decoding: a Low Power Chien-Search Implementation", U.S. Provisional Application No. 61/071,487, filed May 1, 2008 and entitled "Chien-Search System Employing a Clock-Gating Scheme to Save Power for Error Correction Decoder and other Applications", U.S. Provisional Application No. 61/071,468, filed Apr. 30, 2008 and entitled "A Low Power Chien-Search Based BCH/RS Recoding System for Flash Memory, Mobile Communications Devices and Other Applications", U.S. Provisional Application No. 60/996,782, filed Dec. 5, 2007 and entitled "Systems and Methods for Using a Training Sequence in Flash Memory", U.S. Provisional Application No. 61/064,853, filed Mar. 31, 2008 and entitled "Flash Memory Device with Physical Cell Value Deterioration Accommodation and Methods Useful in Conjunction Therewith", U.S. Provisional Application No. 61/129,608, filed Jul. 8, 2008 and entitled "A Method for Acquiring and Tracking Detection Thresholds in Flash Devices", U.S. Provisional Application No. 61/006,806, filed Jan. 31, 2008 and entitled "Systems and Methods for using a Erasure Coding in Flash memory", U.S. Provisional Application No. 61/071,486, filed May 1, 2008 and entitled "Systems and Methods for Handling Immediate Data Errors in Flash Memory", U.S. Provisional Application No. 61/006,078, filed Dec. 18, 2007 and entitled "Systems and Methods for Multi Rate Coding in Multi Level Flash Devices", U.S. Provisional Application No. 61/064,923, filed Apr. 30, 2008 and entitled "Apparatus For Coding At A Plurality Of Rates In Multi-Level Flash Memory Systems, And Methods Useful In Conjunction Therewith", U.S. Provisional Application No. 61/006,805, filed Jan. 31, 2008 and entitled "A Method for Extending the Life of Flash Devices", U.S. Provisional Application No. 61/071,465, filed Apr. 30, 2008 and entitled "Systems and Methods for Temporarily Retiring Memory Portions", U.S. Provisional Application No. 61/064,760, filed Mar. 25, 2008 and entitled "Hardware efficient implementation of rounding in fixed-point arithmetic", U.S. Provisional Application No. 61/071,404, filed Apr. 28, 2008 and entitled "Apparatus and Methods for Hardware-Efficient Unbiased Rounding", U.S. Provisional Application No. 61/136,234, filed Aug. 20, 2008 and entitled "A Method Of Reprogramming A Non-Volatile Memory Device Without Performing An Erase Operation", U.S. Provisional Application No. 61/129,414, filed Jun. 25, 2008 and entitled "Improved Programming Speed in Flash Devices Using Adaptive Programming", and several other co-pending patent applications being filed concurrently (same day).

FIELD OF THE INVENTION

The present invention relates generally to flash memory devices and more particularly to methods and systems for writing on such devices and/or for reading from such devices.

The state of the art is believed to be represented by the following documents inter alia:

US Patent Document 20070168625, entitled "Interleaving policies for flash memory"; and U.S. Pat. No. 6,996,004, entitled "Minimization of FG-FG coupling in flash memory".

Paulo Cappelletti, Clara Golla, Piero Olivo, Enrico Zanoni, "Flash Memories", Kluwer Academic Publishers, 1999

G. Campardo, R. Micheloni, D. Novosel, "VLSI-Design of Non-Volatile Memories", Springer Berlin Heidelberg New York, 2005

Wear leveling, according to Wikipedia, "is a technique for prolonging the service life of some kinds of erasable computer storage media, such as flash memory. The term has also been used by Western Digital to describe their hard disk preservation technique, but hard disks are not generally wear-leveled devices . . . ".

EEPROM and flash memory media have individually erasable segments, each of which can be put through a finite number of erase cycles before becoming unreliable. This can be anywhere between 10,000 and 1,000,000 cycles, for example, for NAND flash devices. Erasable optical media such as CD-RW and DVD-RW are rated at up to 1,000 cycles (100,000 cycles for DVD-RAM media). Wear-leveling attempts to work around these limitations by arranging data so that erasures and re-writes are distributed evenly across the medium. In this way, no single sector prematurely fails due to a high concentration of write cycles.

"Conventional file systems like FAT, ext2 and NTFS were originally designed for magnetic disks and as such rewrite many of their data structures (such as their directories) repeatedly in place. Some file systems aggravate the problem by tracking last-access times, which can lead to file metadata being constantly rewritten in-place. There are several techniques for extending the life of the media: a. A checksum or error-correcting code can be kept for block or sector in order to detect errors or correct errors; b. A pool of reserve space can also be kept. When a block or sector does fail, future reads and writes to it can be redirected to a replacement in that pool; c. Blocks or sectors on the media can be tracked in a least recently used queue of some sort. The data structures for the queue itself must either be stored off-device or in such a way that the space it uses is itself wear-leveled.

"On flash memory devices, such as CompactFlash and Secure Digital cards, these techniques are implemented in hardware by a built-in microcontroller. On such devices, wear-leveling is transparent and most conventional file systems can be used as-is on them. Wear-leveling can also be implemented in software by special-purpose file systems such as JFFS2 and YAFFS on flash media or UDF on optical media. All three are log-structured file systems in that they treat their media as circular logs and write to them in sequential passes. Some storage interfaces do not in themselves perform wear leveling."

U.S. Pat. No. 6,850,443 describes wear leveling techniques for flash EEPROM systems.

The disclosures of all publications and patent documents mentioned in the specification, and of the publications and patent documents cited therein directly or indirectly, are hereby incorporated by reference.

SUMMARY OF THE INVENTION

The following terms may be construed either in accordance with any definition thereof appearing in the prior art literature, or in accordance with any definition implied by any portion of the specification, or as follows: Bank, flash memory bank=ordered set (e.g. sequence or array) of flash memory), all connected to a single data source, such as a PC through the USB interface sr, via a unique and separate interface such as NAND Flash interface. Since different banks each may be connected to the data source via their own interface, they may be accessible in parallel. Bit error rate=the average proportion of bits within a physical page, which are erroneous. This may be measured through experiments in which several pages (of the same type) are programmed and following cycling and retention are read back and compared to their original contents. The bit error rate is then the ratio between the average number of bit errors per page and the length of the page in bits. The bit error rate (BER) may vary between individual devices. Block=a set of flash memory device cells which must, due to physical limitations of the flash memory device, be erased together. Also termed erase sector, erase block. Each block typically comprises an ordered set (e.g. sequence or array) of at least one physical page which are all erased simultaneously by each erase operation, the set typically comprising a predetermined number of typically physically adjacent physical pages. Cell: Apparatus into which any of at least two statistically distinguishable ranges of a physical quantity, such as electrical charge, can be induced. Each detectably distinct range has a predetermined association with a digital value, also termed herein "logical value", which is said to be "stored" in the cell. Since induction in a cell, of a target amount of a physical quantity is typically not deterministic and instead typically modeled by a random, Gaussian process centered about the target amount, "storing" an individual digital value in a cell typically comprises striving to induce, in that cell, a target amount of the physical quantity which comprises the center of the range pre-associated with the individual digital value. As a result, the actual amount induced in the cell is, statistically, almost always within the range associated with the individual digital value, at least initially, hence the individual digital value can, statistically, almost always be correctly read from the cell, at least initially. In flash memory applications, a component of flash memory that stores one bit of information (in single-level cell devices) or n bits of information (in a multi-level device having 2 exp n levels). Typically, each cell comprises a floating-gate transistor. n may or may not be an integer. Charge level or degraded level: Amount of charge currently existing in a cell, as opposed to "program level", the amount of charge originally induced in the cell which typically exceeds the current (charge) level due to the phenomenon of gradual degradation of the amount of charge in a cell, over time. Cycling: Repeatedly writing new data into flash memory cells and repeatedly erasing the cells between each two writing operations. Demapping: basic cell-level reading function in which incoming digital n-type data is derived from a physical value representing a physical state in the cell having a predetermined correspondence to the incoming digital value. Digital value: n-tuple of bits represented by a cell in flash memory capable of generating 2 exp n distinguishable levels of a physical value such as charge, where n may or may not be an integer. Erase cycle: The relatively slow process of erasing a block of cells, or, in certain non-flash memory devices, of erasing a single cell or the duration of so doing. An advantage of erasing cells collectively in blocks as in flash memory, rather than individually, is enhanced programming speed: Many cells are erased in a single erase cycle. Erase-write cycle: The process of erasing a block of cells and subsequently writing new data into at least some of them. Flash memory: Non-volatile rewritable computer memory including cells that are erased in blocks rather than individually, but are written into and read from, in smaller units e.g. individually or page by page where at least some of the blocks include more than one page each. Includes NOR-type flash memory, NAND-type flash memory, and PRAM, e.g. Samsung PRAM, inter alia. A flash memory device typically comprises ordered set (e.g. sequence or array) of flash memory cells in conjunction with reading circuitry, writing circuitry and erasing circuitry. Input/output sequence=I/O sequence=transaction: Request from host to read or write a given number of logical pages from or to a flash memory system. A sequence is "short" if the number of logical pages is less than the number of banks in the flash memory system. Interleaving: When writing a logical page into flash memory, distributing the data therein over disparate locations in the flash memory, so as to greatly diminish the probability that the logical page will be stored at a poor quality portion of the flash memory, such that the logical page, when read, will contain more errors than its error correction code can overcome. Distribution need not be regular or strictly alternating. Mapping: basic cell-level writing function in which incoming digital n-tuple is mapped to a physical value by inducing a physical state in the cell, having a predetermined correspondence to the incoming digital value. Page=A portion, typically 512 or 2048 or 4096 bytes in size, of a memory device such as a NAND flash memory device Writing can be performed page by page, as opposed to erasing which can be performed only erase sector by erase sector. A few bytes, typically 16-32 for every 512 data bytes (termed redundancy bytes) are associated with each page (typically 16, 64 or 128 per page), for storage of error correction information. A typical block may include 32 512-byte pages or 64 2048-byte pages. Precise read, soft read: Read the cell threshold voltage in precision greater than the number of the Mapping levels (2 n). The terms precise read or soft read are interchangeable. Programming: The process of writing new data in at least some of the pages of an erase sector. Program level (or: programmed level, originally written level): amount of charge originally induced in a cell to represent a given digital value, as opposed to "charge level". Reprogrammability (Np): An aspect of flash memory quality. This is typically operationalized by a reprogrammability parameter, also termed herein "Np", denoting the number of times that a flash memory or a sub-section of the memory such as a page can be re-programmed (number of erase-write cycles that the device can withstand) before the level of errors is so high as to make an unacceptably number of those errors irrecoverable with high probability given a predetermined amount of memory devoted to redundancy. Typically recoverability is investigated following a conventional aging simulation process which simulates or approximates the data degradation effect that a predetermined time period e.g. a 10 year period has on the flash memory device, in an attempt to accommodate for a period of up to 10 years between writing of data in flash memory and reading of the data therefrom. Retention: of original physical levels induced in the cells; retention is typically below 100% resulting in deterioration of original physical levels into current charge levels. Retention time: Flash storage time without voltage supply or specifically the elapse time between page programs to page read. Symbol: Digital value Logical page: a portion of typically sequential data, whose amount is typically less than or equal to a predetermined amount of data defined to be a pageful of data, which has typically been defined by a host (data source/destination) or user thereof, as a page, and which is sent by the host to a flash memory device for storage and is subsequently read by the host from the flash memory device. Physical page: ordered set (e.g. sequence or array) of flash memory cells which are all written in simultaneously by each write operation, the set typically comprising a predetermined number of typically physically adjacent flash memory cells containing actual data written by and subsequently read by the host, as well as, typically error correction information and back pointers used for recognizing the true address of a page. Pagelet: portion of a logical page which is to be written onto a particular physical page. Reliability: Reliability of a flash memory device may be operationalized as the probability that a worst-case logical page written and stored in that device for a predetermined long time period such as 10 years will be successfully read i.e. that sufficiently few errors, if any, will be present in the physical page/s storing each logical page such that the error code appended to the logical page will suffice to overcome those few errors.

The applicability of certain embodiments of the present invention includes but is not limited to the following applications:

Solid State Disk: A Disk drive built with no moving parts and made of silicon based chips that store the information, such as NAND/NOR Flash, NROM and phase change memories).

Solid State storage applications: Applications which use silicon based chips to store large amounts of memory such as but not limited to USB drives, SD cards, and MP3 players.

Certain embodiments of the invention seek to provide application of interleaving to combat reliability problems in Flash memories.

Certain embodiments of the invention seek to provide breaking of an encoded page into pagelets, typically non-overlapping, which are programmed across an Erase Block and several devices.

Certain embodiments of the invention seek to provide interleaving with different sizes of I/O transactions.

Certain embodiments of the present invention mitigate the bit error rate (BER) problem by distributing each "logical" page across several physical pages in an erase block and/or across several devices. Thus, each "logical" page only suffers from an average bit error rate (BER) and program-erase performance is derived from the average bit error rate (BER) instead of the worst case BER.

According to certain embodiments of the present invention, interleaved programming of the "logical" pages is used, e.g. by breaking them up into pagelets which are programmed into different pages across an erase block and on different devices (if applicable). A read operation of a "logical" page will suffer only from an average bit error rate (BER) and the reliability of the entire system will be a function of the average bit error rate (BER) instead of the worst case BER.

There is thus provided, in accordance with at least one embodiment of the present invention, a flash memory accessory device operative in conjunction with a data source supplying a stream of logical pages including data and a flash memory system including a multiplicity of physical pages, the accessory system comprising logical page distributing apparatus for distributing data from each logical page in the stream between at least two of the multiplicity of physical pages.

Further in accordance with at least one embodiment of the present invention, the multiplicity of physical pages is partitioned into a plurality of erase sectors each having physical pages, wherein the physical pages within an individual erase sector can only be erased in unison, wherein the apparatus for distributing distributes data from each logical page in the stream between physical pages within a single erase sector.

Still further in accordance with at least one embodiment of the present invention, the multiplicity of physical pages is partitioned into at least first and second erase sectors each having physical pages, wherein the physical pages within each erase sector can only be erased in unison, wherein the apparatus for distributing distributes information from each logical page in the stream between at least a first physical page within the first erase sector and at least a second physical page within the second erase sector.

Further in accordance with at least one embodiment of the present invention, the flash memory system comprises at least first and second flash memory banks which are accessible in parallel and wherein the apparatus for distributing distributes information from each logical page in the stream between at least a first physical page within the first flash memory bank and at least a second physical page within the second flash memory bank.

Also provided, in accordance with at least one embodiment of the present invention, is a flash memory accessory device operative in conjunction with a data source supplying a stream of logical pages including data and a flash memory system including a multiplicity of flash memory cells, wherein the multiplicity of flash memory cells can be divided into several subsets of flash memory cells each having a characteristic range of bit error rates which differs from the characteristic range of bit error rates of at least one other subset of flash memory cells, the accessory device comprising bit error rate (BER) distributing apparatus operative to distribute data from each logical page in the stream between at least two of the subsets.

Further in accordance with at least one embodiment of the present invention, the multiplicity of flash memory cells can be partitioned into several orthogonal partitions of flash memory cells, each partition defining several subsets into which the multiplicity of flash memory cells is divided, each subset having a characteristic range of bit error rates which differs from the characteristic range of bit error rates of at least one other subset of flash memory cells defined by the same partition, wherein the bit error rate (BER) distributing apparatus is operative to distribute data from each logical page in the stream between at least two subsets defined by each of at least two of the partitions.

Further in accordance with at least one embodiment of the present invention, one of the orthogonal partitions comprises partitioning of the multiplicity of flash memory cells into physical pages.

Additionally in accordance with at least one embodiment of the present invention, the physical pages include at least first and second layers and wherein the multiplicity of flash memory cells comprises a multiplicity of multi-level cells each storing at least two bits including a most significant bit (MSB) and a least significant bit (LSB) thereby to define a multiplicity of MSBs and a multiplicity of LSBs and wherein the apparatus for distributing is also operative to distribute at least a first MSB from among the multiplicity of MSBs and a first LSB from among the multiplicity of LSBs to the first layer and to distribute at least a second MSB from among the multiplicity of MSBs and a second LSB from among the multiplicity of LSBs to the second layer.

Still further in accordance with at least one embodiment of the present invention, one of the orthogonal partitions comprises partitioning of the multiplicity of flash memory cells into erase sectors.

Additionally in accordance with at least one embodiment of the present invention, one of the orthogonal partitions comprises partitioning of the multiplicity of flash memory cells into flash memory devices.

Further in accordance with at least one embodiment of the present invention, one of the orthogonal partitions comprises partitioning of the multiplicity of flash memory cells into flash memory banks.

Still further in accordance with at least one embodiment of the present invention, the apparatus for distributing is operative to distribute data from each logical page in the stream between at least two subsets defined by each of the partitions.

Additionally in accordance with at least one embodiment of the present invention, the logical page distributing apparatus is operative to distribute at least a pagelet within at least a logical page onto a physical page determined by computing a predetermined function of a logical address received from a controller.

Further in accordance with at least one embodiment of the present invention, the first and second physical pages are read from simultaneously when it is desired to access therefrom, a logical page stored therewithin.

Additionally in accordance with at least one embodiment of the present invention, the first and second physical pages are written to simultaneously when it is desired to store a logical page therewithin.

Additionally in accordance with at least one embodiment of the present invention, the page-distributing apparatus comprises apparatus for partitioning, for at least one set of logical pages, each of several logical pages in the set into pagelets and apparatus for grouping pagelets from the several logical pages together using a predetermined pagelet grouping scheme to form a multi-origin physical page-ful of data containing pagelets originating from more than one logical page.

Further in accordance with at least one embodiment of the present invention, the pagelet grouping scheme comprises a pagelet permutation scheme.

Still further in accordance with at least one embodiment of the present invention, the at least one set of logical pages comprises a plurality of sets of logical pages and wherein the pagelet permutation scheme is characterized in that not all of the plurality of sets of logical pages are permuted in the same way.

Additionally in accordance with at least one embodiment of the present invention, the device also comprises logical page distributing apparatus for distributing data from each logical page in the stream between at least two of the multiplicity of physical pages, and wherein the bit error rate (BER) distributing apparatus is operative to distribute the two physical pages in two of the subsets respectively.

Also provided, in accordance with at least one embodiment of the present invention, is a system for storing a plurality of logical pages in a set of at least one flash device, each flash device including a set of at least one erase block, the system comprising apparatus for distributing each of the plurality of logical pages over substantially all of the erase blocks in substantially all of the flash devices, thereby to define, for each logical page, a sequence of pagelets thereof together including all information on the logical page and each being stored within a different erase block in the set of erase blocks; and apparatus for reading each individual page from among the plurality of logical pages including apparatus for calling and ordering the sequence of pagelets from different erase blocks in the set of erase blocks.

Further in accordance with at least one embodiment of the present invention, the set of flash devices includes a set of at least one bank of flash devices, each bank in the set of banks including at least one flash device.

Further provided, in accordance with at least one embodiment of the present invention, is a method for facilitating interaction between a data source supplying a stream of logical pages including data and a flash memory system including a multiplicity of physical pages, the method comprising distributing data from each logical page in the stream between at least two of the multiplicity of physical pages.

Also provided, in accordance with at least one embodiment of the present invention, is a method for facilitating interaction between a data source supplying a stream of logical pages including data and a flash memory system including a multiplicity of flash memory cells, wherein the multiplicity of flash memory cells can be divided into several subsets of flash memory cells each having a characteristic range of bit error rates which differs from the characteristic range of bit error rates of at least one other subset of flash memory cells, the method comprising distributing data from each logical page in the stream between at least two of the subsets.

Additionally provided, in accordance with at least one embodiment of the present invention, is a method for storing a plurality of logical pages in a set of at least one flash device, each flash device including a set of at least one erase block, the method comprising distributing each of the plurality of logical pages over substantially all of the erase blocks in substantially all of the flash devices, thereby to define, for each logical page, a sequence of pagelets thereof together including all information on the logical page and each being stored within a different erase block in the set of erase blocks; and reading each individual page from among the plurality of logical pages including apparatus for calling and ordering the sequence of pagelets from different erase blocks in the set of erase blocks.

Any suitable processor, display and input means may be used to process, display, store and accept information, including computer programs, in accordance with some or all of the teachings of the present invention, such as but not limited to a conventional personal computer processor, workstation or other programmable device or computer or electronic computing device, either general-purpose or specifically constructed, for processing; a display screen and/or printer and/or speaker for displaying; machine-readable memory such as optical disks, CDROMs, magnetic-optical discs or other discs; RAMs, ROMs, EPROMs, EEPROMs, magnetic or optical or other cards, for storing, and keyboard or mouse for accepting. The term "process" as used above is intended to include any type of computation or manipulation or transformation of data represented as physical, e.g. electronic, phenomena which may occur or reside e.g. within registers and/or memories of a computer.

The above devices may communicate via any conventional wired or wireless digital communication means, e.g. via a wired or cellular telephone network or a computer network such as the Internet.

The apparatus of the present invention may include, according to certain embodiments of the invention, machine readable memory containing or otherwise storing a program of instructions which, when executed by the machine, implements some or all of the apparatus, methods, features and functionalities of the invention shown and described herein. Alternatively or in addition, the apparatus of the present invention may include, according to certain embodiments of the invention, a program as above which may be written in any conventional programming language, and optionally a machine for executing the program such as but not limited to a general purpose computer which may optionally be configured or activated in accordance with the teachings of the present invention.

Any trademark occurring in the text or drawings is the property of its owner and occurs herein merely to explain or illustrate one example of how an embodiment of the invention may be implemented.

BRIEF DESCRIPTION OF THE DRAWINGS

Certain embodiments of the present invention are illustrated in the following drawings:

FIGS. 8-12 are simplified flowchart illustrations and tables useful in understanding certain embodiments of the present invention.

DETAILED DESCRIPTION OF CERTAIN EMBODIMENTS

Figure 1A:
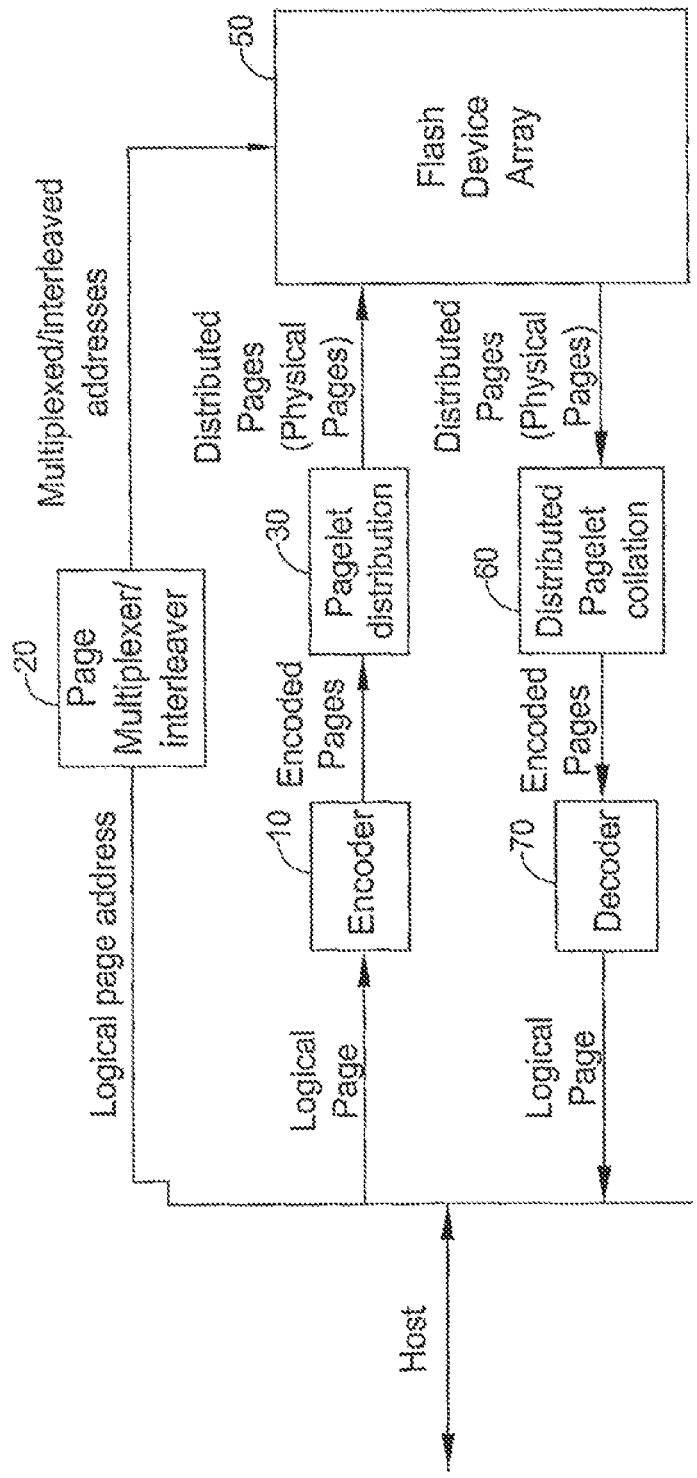
FIG. 1A is a simplified block diagram illustration of a system for distributing logical pages evenly within flash device memory of uneven quality, which is constructed and operative in accordance with certain embodiments of the present invention.

Today's Flash memory devices store information as charge in either a floating gate transistor or an NROM transistor. Multi-Level Cells (MLC) store several bits by setting the amount of charge in the cell. The amount of charge is then measured by a detector, e.g. by a threshold voltage of the cell's transistor gate. Due to inaccuracies during the multiple erase and programming procedures and because of charge loss due to time and temperature (also known as retention), the measured levels suffer from a random distortion. As a result, some errors appear when the device is read. This reliability is then measured by the error probability or by a bit error rate (BER).

Flash devices are organized into pages. Each page contains a section allocated for data (512 bytes-4 Kbytes) and a small amount of bytes (16-32 bytes for every 512 data bytes) allocated for redundancy and back pointers. The redundancy bytes are used to store error correcting information, for correcting errors which may have occurred e.g. during the page Read. Each Read and Program operation is performed on an entire page. A number of pages are grouped together to form an Erase Block (erase block). A page cannot be erased unless the entire erase block which contains it is erased.

An important measure of Flash device quality is the number of times (Np) the device is guaranteed to be able to be reprogrammed before irrecoverable errors occur i.e. before the allocation of 16-32 bytes of redundancy per 512 bytes of data bytes becomes insufficient to correct errors. The higher the number of program-erase cycles, the higher the bit error rate (BER). Thus, today's multi-level cell devices can perform around Np=1000 cycles or less before the allocation of 16-32 bytes of redundancy per 512 bytes of data bytes becomes insufficient to correct errors.

In some types of Flash memory, the bit error rate varies across pages within the erase block. In practically all types of Flash device the bit error rate (BER) varies between individual devices. Thus, in order to assure a given error performance or a given number of program-erase cycles, it is conventional to compute the Np (number of program-erase cycles) to accommodate the worst case device and the worst case page within each erase block.

One application of Flash devices is solid state disks (SSD) where an array of Flash devices is used as the storage media of a computer hard drive, thus, enjoying the fast Read and Access times of Flash chips. In a solid-state disk (SSD), several Flash chips are programmed and read simultaneously to increase the Read and program speeds. For this purpose, SSDs are arranged into multiple "Banks" that allow parallel read/write operation, each Bank typically comprising a number of Flash chips. The Read/Program performance is multiplied by the number of "Banks", compared with a single Flash chip. Each "Bank" may comprise multiple chips and each chip may comprise multiple erase sectors. Each solid-state disk may, for example, comprise 4 or 8 banks. Each erase sector or erase block may for example comprise 128 pages.

Figure 2:
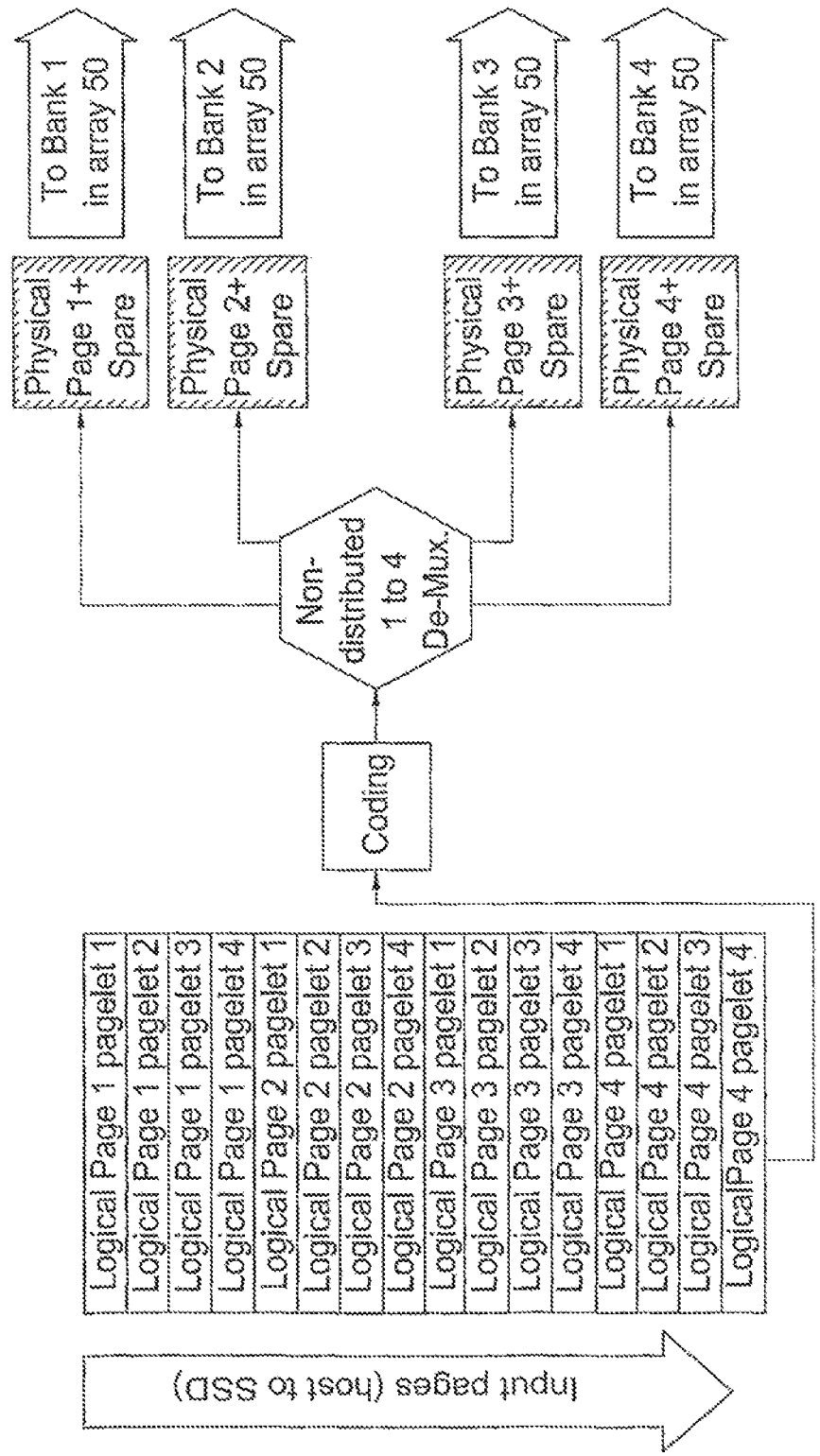
FIG. 2 is a prior art scheme for storing logical pages within flash device memory in which each logical page is stored in one or more adjacent physical pages within a single erase sector, device and bank, such that the reliability of the device is determined by the worst page's bit error rate (BER)

The incoming pages are coded and de-multiplexed into multiple "banks". This increases the programming speed. The error probability across multiple devices or across an erase block is not uniform and causes non-uniform error probability among devices and EBs. Simple allocation of entire logical pages to banks, as shown in prior art FIG. 2, reduces the reliability to the worst case "bank" and worst case page within the erase block. The term "spare" in FIG. 2 refers to the fact that typically, each page in NAND Flash is made up of data, say 2K bytes, plus "spare": additional spare bytes, e.g. 128 bytes, used for storing error correction information and management data also termed herein meta-data.

Advanced wear leveling is used to control error probability variances due to different program-erase cycles by mapping "logical" pages ("logical" pages contain a sequence of data sent/read by the host) into "physical" pages ("physical" pages contain the actual data being programmed onto the Flash devices, including, on top of the data read/written by the host, error correction information and back pointers used for recognizing the true address of a page) in a way that evens-out the program-erase cycles over all Erase Blocks, thus attempting to even-out error probability across the data blocks. But even such methods cannot guarantee even error probability due to the variance across devices and across pages in an erase block. The EBs and devices are physically different and the wear leveling does not address these differences.

A top-level block diagram of a system for distributing logical pages evenly within flash device memory of uneven quality, according to one embodiment of the invention, is described with reference to FIG. 1A. Embodiments of the various components of the system of FIG. 1A (or FIG. 1B) are next described with reference to the logical page distribution schemes of FIGS. 3-4 as compared to the logical page distribution scheme of prior art FIG. 2. One possible structure for flash memory is described in FIG. 5. Three alternative methods for writing on that structure according to certain embodiments of the present invention, using the system of FIG. 1A (or FIG. 1B), are presented in FIGS. 6A-6C. A method for reading from that structure according to certain embodiments of the present invention, using the system of FIG. 1A (or FIG. 1B), is presented in FIG. 7.

Referring to FIG. 1A, according to certain embodiments of the invention, the system comprises an Encoder 10, Page Demux/Mux 20, physical page mapper+Interleaver 30, a "free" page/erase block mapper and locator 40 and a Flash array 50 which may comprise several banks of commercially available flash memory devices. A Host 60, which may for example comprise a personal computer having an operating system and application programs such as Word or a digital entertainment device, writes to the flash array 50, through a Flash controller such as the controllers distributed by STMicroelectronics and SMSC. The host subsequently reads from the flash array 50 a sequence of Logical pages. For example, in USB drives, the Host 60 may send an address to be read from or written to, per each pagelet of 512 bytes. These may be aggregated into pages by the NAND controller.

Figure 1B:
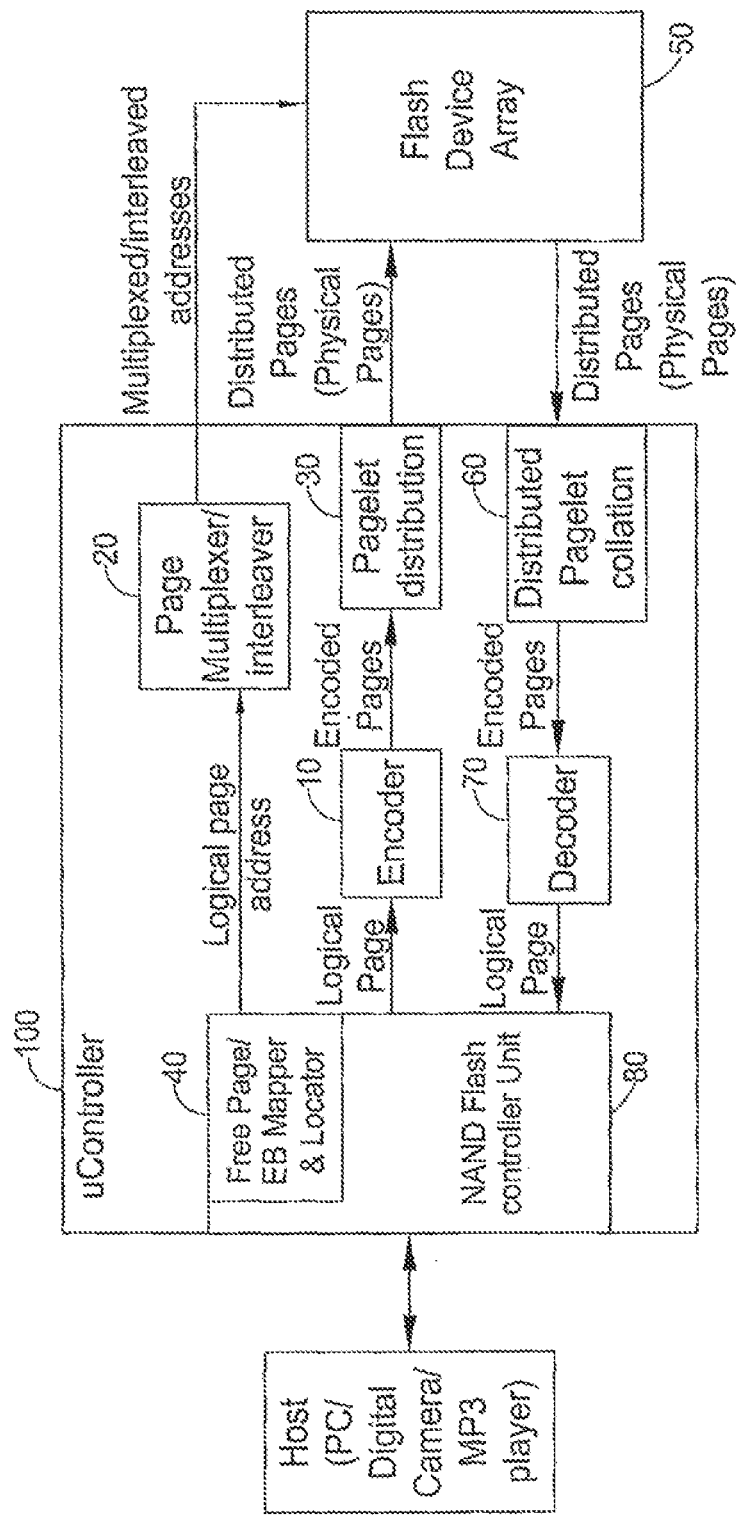
FIG. 1B is a variation on the system of FIG. 1B in that some of the functional units of FIG. 1A are implemented within a Flash ucontroller which controls a NAND flash memory array, all in accordance with certain embodiments of the present invention.

Alternatively, functional units of FIG. 1A may be implemented within a Flash uController which controls the NAND flash memories, as shown in FIG. 1B. The uController 100 may be based on commercially available uController systems such as those distributed by Samsung, Eureka Technology, Denali, Arasan and Barco. The uController 100 translates read/write commands generated by the host through a standard interface, such as but not limited to a Universal Serial Bus (USB), Secure Disk (SD) interface, to NAND Flash read/program page commands and Erase Block commands. The uController 100 may be regarded as implementing a level of virtualization, concealing the fact that the information is being written and read from a NAND flash e.g. by concealing the fact that data must be written to pages of a certain size and that a page may not be rewritten unless the entire erase block that contains it is erased.

Certain embodiments of the Encoder 10, Decoder 70, Pagelet distribution unit 30, Distributed pagelet collation unit 60 and the page multiplexer 30 are each described in detail below. However generally, these functional units may be added to (or integrated with) the conventional functional units occurring in a conventional NAND Flash controller 80 so as to provide an additional layer of virtualization in accordance with certain embodiments of the present invention. The additional virtual layer presents to the Flash controller a NAND flash with larger pages than the actual physical pages residing within the actual NAND Flash devices; these larger pages are referred to herein as logical pages. For example, each logical page may be 4 times the size of the physical pages. The encoder 10 and decoder 70 each work on pages of the size stored in the flash. Units 30 and 60 mix several encoded pages together and the page multiplexer then spread several (say, 4) pages over different locations in the flash device. Various pages may be distributed within a block or across blocks or both.

The above functional units preferably interact as follows when writing occurs:

a. The logical pages are encoded by encoder 10 and appended with redundancy bytes to form Encoded Pages. The logical pages may be divided into several pagelets (such as for example 4 pagelets) the size of a physical page and each physical page may be encoded separately.

b. The Encoded pages are broken down into pagelets by page multiplexer 20 and then grouped together with pagelets of other encoded pages to form physical pages.

c. "Page Multiplexer\Interleaver" 20 interleaves the pages between several devices, several erase blocks, and/or several locations within an erase block. A particular advantage of certain embodiments of the present invention is that pagelets (portions of pages) assigned to several banks, can be written to, and read from, the various banks simultaneously to increase write performance and read performance respectively.

d. 'free' page/erase block mapper 40 translates a logical address sent by the host 60 into a "physical" address, the actual Erase Block address on each bank of the array 50. A "free" page is one which has not been programmed hence is in an erased state. The "page multiplexer" 20 then addresses pages addressed with respect to the beginning of each Erase Block.

A read operation typically comprises the same steps in reverse order i.e. first (d) then (c) then (b) then (a).

Certain embodiments of the Pagelet distributor 30 of FIG. 1A are now described. Typically, this component takes J "Encoded" pages and breaks down each page into J pagelets. The pagelets may then be grouped together into physical pages such that each physical page contains J sub-pagelets, each sub-pagelet from a different "Encoded" page. It is appreciated that throughout the present specification, a sub-pagelet may be a pagelet.

It is appreciated that J may be any suitable integer such as 4. J may be chosen to be sufficiently large as to average the BER over several pages and to obtain approximately the same bit error rates for all "logical addresses" (those defined by the NAND controller).

The following notation is used herein to identify pagelets: Epagelet_ij=the j'th sub-pagelet of the i'th encoded page. Ppagelet_ij denotes the j'th sub-pagelet of the i'th physical page.

Any of the following schemes may be pre-selected for ordering the pagelets within the "physical" pages e.g. as follows (i=1 ... J, j=1 ... J):

Scheme a: Ppagelet_ij=Epagelet_ji. For example, if a sequence of 4 encoded pages is provided, each encoded page may be broken down to 4 Epagelets. Then, Epagelet 1 of each of the encoded pages 1, 2, 3 and 4 are all grouped together to construct physical page #1. Similarly, physical pages 2, 3, 4 may be constructed with Epagelets 2, 3, and 4 respectively.

Scheme b: Ppagelet_ij=Epagelet [(i+j−2 modulo J)+1]j. For example, given a sequence of 4 encoded pages, each encoded page may be broken down to 4 Epagelets. Then Epagelets 1, 2, 3 and 4 of encoded pages 1 2 3 and 4 respectively are grouped together, in order, to form Ppagelet 1. Epagelets 2, 3, 4 and 1 of encoded pages 1 2 3 and 4 respectively are grouped together, in order, to form Ppagelet 2. Epagelets 3, 4, 1 and 2 of encoded pages 1 2 3 and 4 respectively are grouped together, in order, to form Ppagelet 3 and Epagelets 4, 1, 2 and 3 of encoded pages 1 2 3 and 4 respectively are grouped together, in order, to form Ppagelet 4.

More generally, a permutation function Prm(k) may be defined from the set {0, 1, ..., J*J−1} to {0, 1, ..., J*J−1} and then assign Ppagelet_ij may be Epagelet [Prm(i−1+(j−1)*J) modulo J+1] [Prm((i−1)+(j−1)*J) div J+1].

Figure 3:
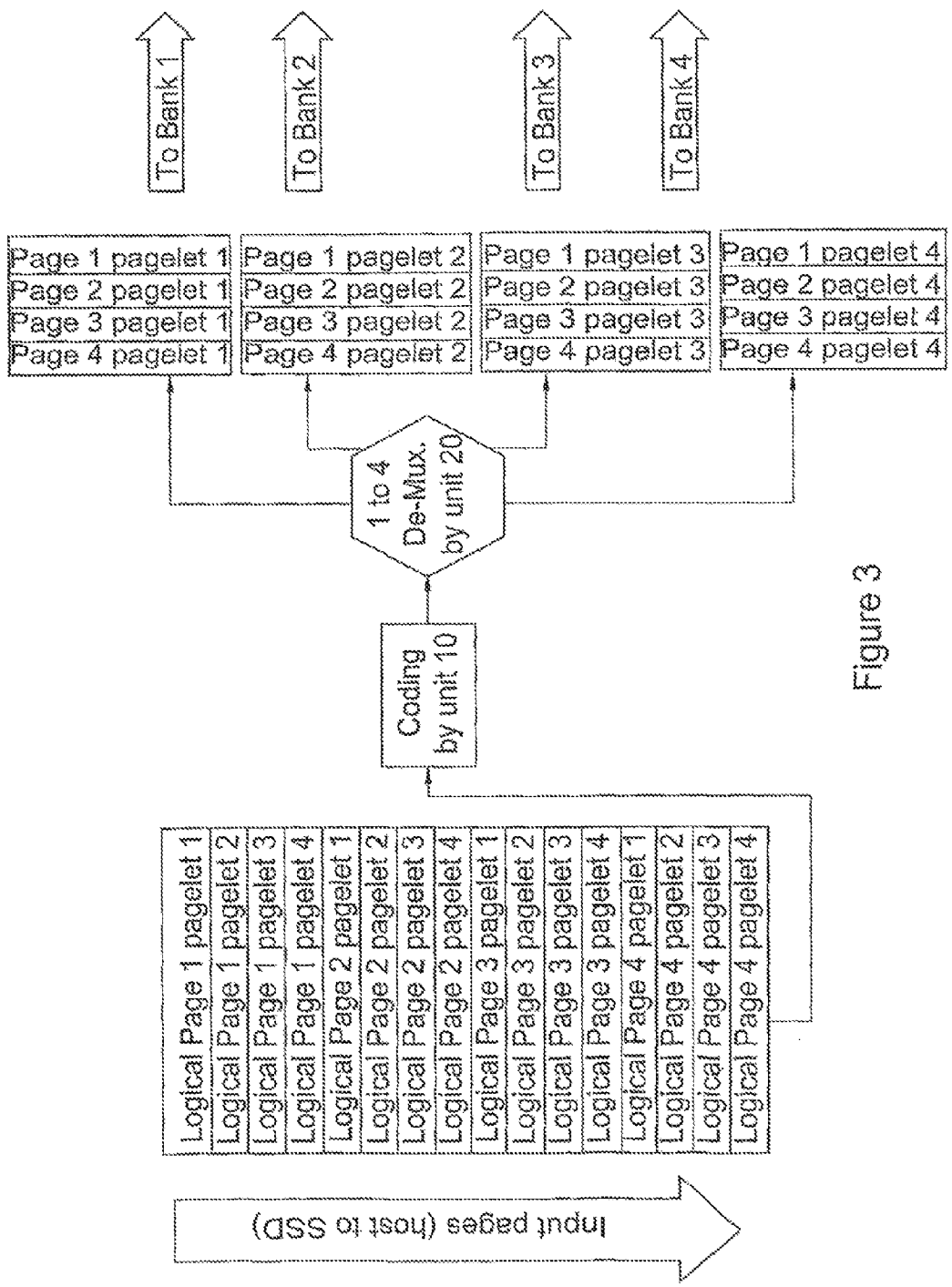
FIG. 3 is a scheme, constructed and operative in accordance with certain embodiments of the present invention, for storing logical pages within a flash memory device including a plurality of banks e.g. 4 banks, in which each logical page is divided e.g. partitioned into a plurality of pagelets which are respectively distributed between the plurality of banks.
Figure 4:
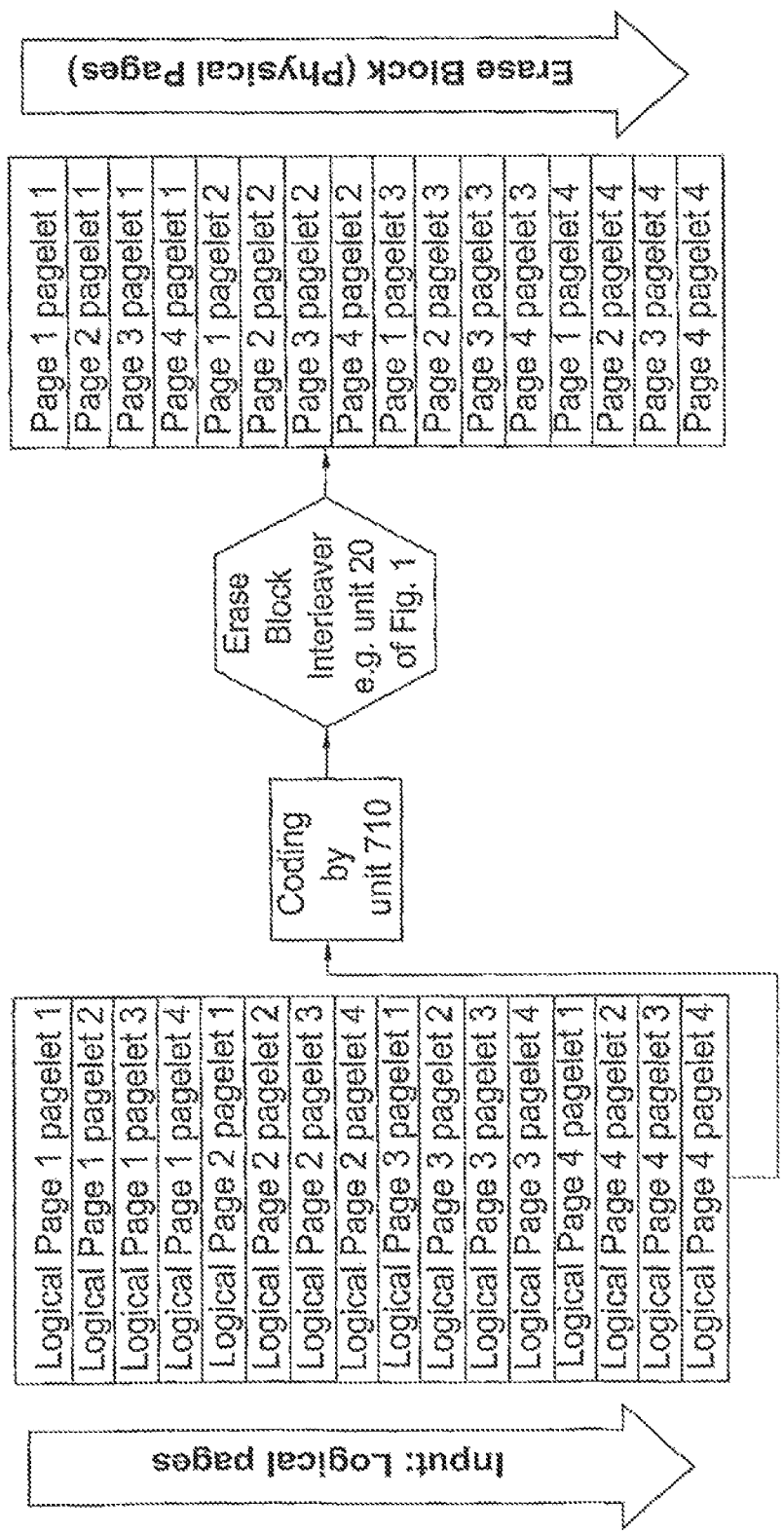
FIG. 4 is a scheme, constructed and operative in accordance with certain embodiments of the present invention, for storing logical pages within flash device memory including at least one erase sector of uneven quality, in which each logical page is divided e.g. partitioned into a plurality of pagelets which are interleaved through at least one erase sector.

A particular advantage of using a permutation function as above, rather than always sequencing pagelets in the following order: 1, 2, 3, ... J and always sequencing logical pages in the following order: 1, 2, 3, ... J e.g. as shown in FIGS. 3-4, is that even if there is a regularity in the variation of flash memory quality, e.g. such that the initial portions of each erase block tend to be of poor quality, or such that the last erase block in each device tends to be of poor quality, the logical data is generally evenly distributed over the high-quality flash memory portions and the low-quality flash memory portions. If there is no regularity in the variation of flash memory quality, i.e. if the variation is generally random, then even without permutation, the logical data is evenly distributed over the randomly occurring high-quality low-quality flash memory portions.

FIG. 3 illustrates an interleaving scheme which breaks down the "encoded" pages into several e.g. 4 pagelets and programs them across typically the same number e.g. 4 memory banks according to the above scheme (b). FIG. 4 illustrates an interleaving scheme which breaks down the "encoded" pages into 4 (say) pagelets and programs them across an erase block in a single memory bank according to the above scheme (b).

The above discussion assumes that the physical pages are the same size as the encoded pages. In some applications, the physical pages are larger, or smaller, than the encoded pages such that the physical page contains P pagelets. Thus J encoded Pages are mapped into J*J/P physical pages. For example, given a sequence of 4 encoded pages (one "logical" page), each encoded page may be broken down to J=4 Epagelets and each physical page may contain P=8 Ppagelets (the same size of an Epagelet), in which case Epagelets 1 and 2 of encoded pages 1, 2, 3 and 4 respectively are grouped together to form physical page 1, whereas Epagelets 2 and 3 of encoded pages 5, 6, 7 and 8 are grouped together to form physical page 2. Thus, the 4 encoded pages (one logical page) are stored over 2 physical pages.

Figure 8:
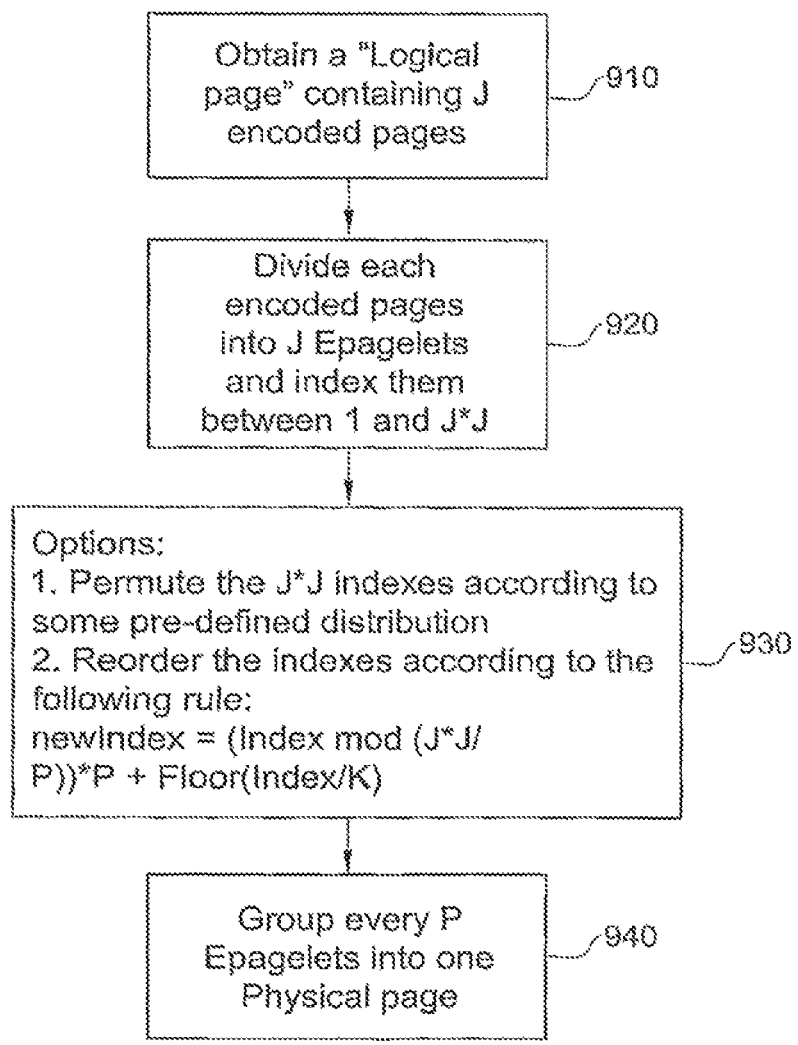

FIG. 8 illustrates a method for partitioning encoded pages into pagelets and then spreading the pagelets over physical pages (each capable of storing P pagelets). The method supports two possible options for, ordering the Epagelets into the physical pages: according to a predefined permutation or according to a formula.

Certain embodiments of the Physical Page interleaver 30 of FIG. 1A are now described.

Physical Page interleaver 30 obtains J "physical-pagefuls of data and maps them into the flash array. If the Flash array contains L banks, an L-fold increase in performance may be obtained if each physical-page-ful of data is written into all L banks simultaneously. The mapping of the "physical-page-fuls may be done using several strategies such as but not limited to the following:

Strategy a: Each physical-page-ful of data is written to a different bank, so as to effectively average bit error rate (BER) over banks. In this embodiment, physical-page-ful j may be programmed into physical page j−1 mod L+1 of bank whose serial number is: floor((j−1)/L)+1, where Floor(x) is the largest integer which is still smaller or equal to x. For example, consider the case of a sequence of 8 "physical" pages and an array with 4 banks. Pages 1 and 5 in the sequence are inserted to the first bank. Pages 2 and 6 are inserted to the second bank and pages 3, 7 and 4, 8 are inserted to the 3rd and 4th banks respectively.

Strategy b: Each physical-page-ful of data is written to a different physical page within an Erase Block (within a device) so as to effectively average bit error rate (BER) over pages. In this embodiment, if the erase block contains M pages then "physical" page j is programmed into page (j−1)*S+S0 modulo M+1 with respect to the beginning of the erase block where S and S0 are the step size and initial step respectively (in pages). For example, consider an array with only one bank, and assume the Erase blocks contain 16 physical pages, the step size is 5 physical pages and the initial step is 1 physical page. Furthermore, assume that there is a sequence of 8 "physical" pages to be programmed within one "logical page" (j=8 here by the host. Pages 1, 2, 3, 4 in the sequence are programmed respectively to pages 1, 6, 11, 16 in the erase block. Pages 5, 6, 7, 8 in the sequence are programmed to pages 5, 10, 15, 3 respectively, in the erase block.

Strategy c: Each physical-page-ful of data is written to a different bank and to a differently positioned page within each bank so as to average the bit error rate (BER) both over devices and over physical pages within an erase block. Strategies a and b are orthogonal hence may be combined. For example, consider an array with 4 banks, each including an erase block with 16 pages, a step size of 4 physical pages, an initial step of 1 physical page, and a sequence of 4 "physical" pages to be programmed in each I/O operation. Page 1 in the sequence are programmed to page 1 of the first bank. Page 2 in the sequence are programmed to page 5 in Bank 2. Pages 3, 4 in the sequence are programmed to page 9 in bank 3, and page 13 in bank 4 respectively.

Certain embodiments of the Free page/erase block mapper and locator 40 of FIG. 1B are now described. A conventional NAND flash controller 80 typically comprises a free page/erase block mapper and locator 40 as part of its memory management unit. This conventional functional unit, 40, within a conventional NAND flash controller 80 allocates empty Erase blocks to be programmed or finds the appropriate erase blocks on the array which contain the appropriate addresses to be read. Typically, unit 40 translates between virtual addresses generated by the controller which "thinks" that the NAND flash has larger pages than it actually does.

Several methods are known in the art for allocating erase blocks. According to one such method, a predefined address computation unit is used. In this case there is a one to one mapping between the "logical" address and the actual address of the "physical" page on the device. If a certain page has been previously programmed due to a previous programming of the same "logical" page, the entire Erase block is erased and reprogrammed with the new data. As an example, assume that a sequence of 4 "logical" pages are to be programmed to addresses 33, 34, 35 and 36. The array contains 4 banks, each bank containing devices with erase block size of 16 pages. A possible one to one mapping may be: erase block#1=floor(33/4/16)+1. If pages 65, 66, 67 and 68 are to be programmed, all physical pages may be mapped to erase block #2 of all devices. The Interleaver may then rename the addresses 1, 2, 3 and 4 relative to the beginning of erase block #1.

Alternatively, the mapper may contain a lookup block table as shown in FIG. 9 where each Block in the Flash memory is intended to contain a consecutive set of virtual addresses, say 256 addresses. These sets of addresses need not be ordered within the Flash and may be programmed to non consecutive Blocks. The table also contains a page usage vector which determines which page is being used and which is not.

In order to save time, a block which was previously used may not be actually erased but instead merely marked as erased, whereas in fact, a different Erase Block is used in its stead. In this case the mapper finds a free erase block for each bank in the array and the pages are programmed to that free erase block. One way of implementing this embodiment is to maintain a table of all free EBs currently available and to update the table each time an erase block has been used or erased, e.g. as shown in FIGS. 9-10.

Figure 5:
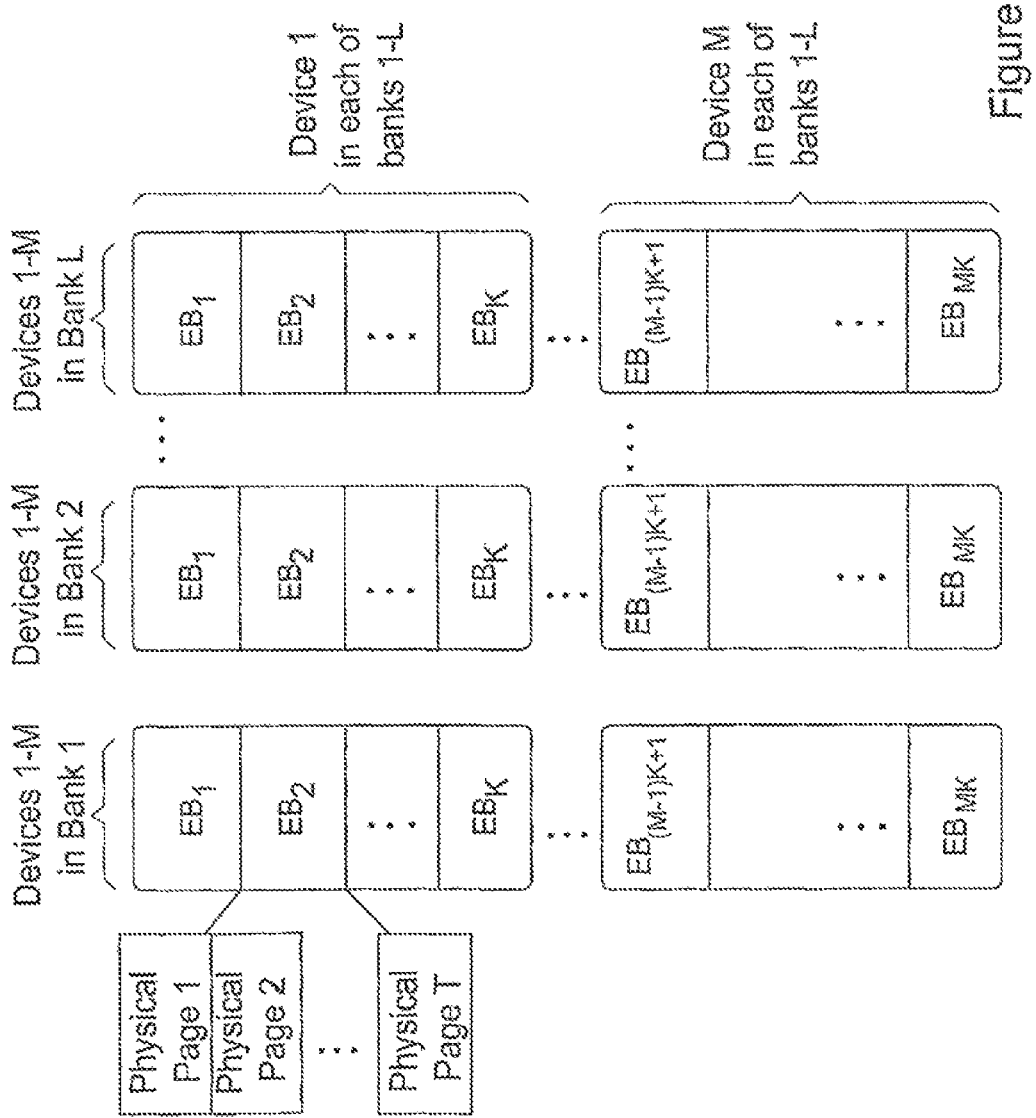
FIG. 5 is a simplified prior art block diagram illustration of an example of a flash memory having L banks, each bank having M devices, each device having K erase blocks, each erase block having T physical pages.

Certain embodiments of the flash array 50 of FIG. 1A are now described. As shown in FIG. 5, flash array 50, according to an embodiment of the present invention, comprises L banks of Flash memory devices. Each Bank comprises M Flash memory devices. Each memory device contains K Erase Blocks and each Erase Block contains T pages. At each bank, the EBs are numbered serially from 1 to MK. In each erase block, the pages are numbered from 1 to T, resetting at the beginning of each erase block.

Figure 13:
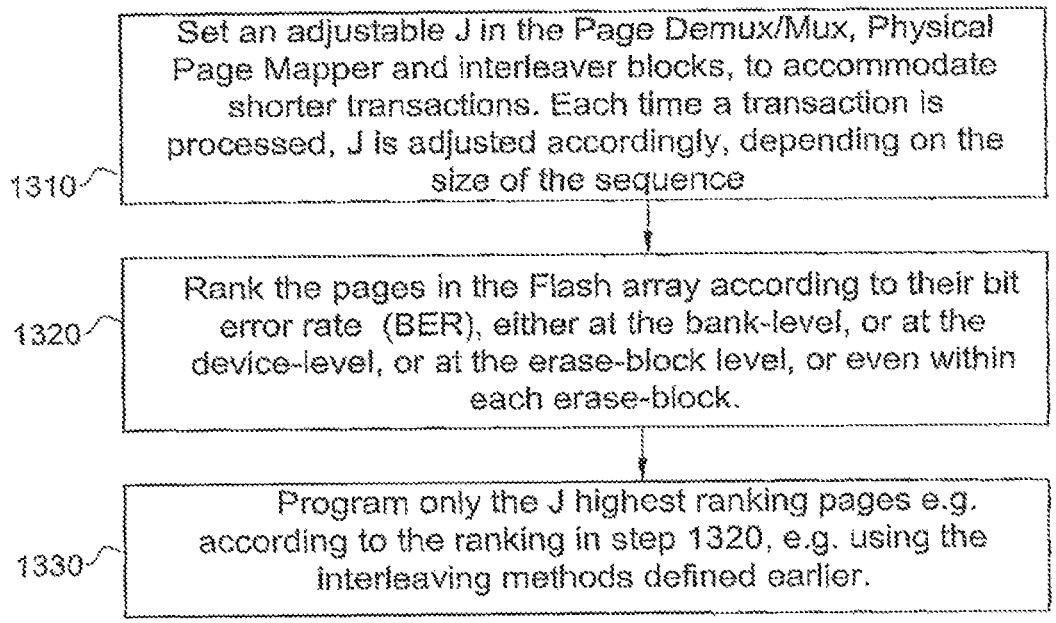
FIG. 13 is a simplified flowchart illustration of a method useful in handling short I/O requests, in accordance with certain embodiments of the present invention.

Optionally, special treatment is allotted to short Input/output Sequences. This is because, in order to fully benefit from certain embodiments shown and described herein, all input/output sequences may need to contain at least as many "logical" pages as the number of banks (i.e. J=L). The NAND Flash controller 80 may append zeros to sequences which were sent by the host and which are shorter than the logical page. Thus, a memory device may be selected whose number of banks equals the number of pages in a typical I/O transaction in a given application. Even if a particular application is characterized by a central tendency toward a transaction (input/output sequence) of a particular length, some transactions may be shorter. If these transactions are padded with blank pages to obtain a total of J pages, this wastes both time and space during the sequence programming. In order to enhance handling of short I/O requests, which are recognized as such by the flash device's NAND controller 80, the method of FIG. 13 may be performed. The method of FIG. 13 may include some or all of the following steps, suitably ordered e.g. as shown:

Step 1310: Set an adjustable J in the Page Demux/Mux, Physical Page Mapper and interleaver blocks, to accommodate shorter transactions. Each time a transaction is processed, J is adjusted accordingly, depending on the size of the sequence.

Step 1320: Rank the pages in the Flash array according to their bit error rate (BER), either at the bank-level, or at the device-level, or at the erase-block level, or even within each erase-block.

Step 1330: Program only the J highest ranking pages e.g. according to the ranking in step 1320, e.g. using the interleaving methods defined earlier.

Another option is to select a subset of pages such that their average bit error rate (BER) is above or equal to that of the average bit error rate (BER), averaged over typical number of pages.

A particular advantage of handling short I/O sequences as described above with reference to FIG. 13, is that this ensures that the reliability of the shorter transactions is not determined by the bit error rates of the worst pages, but rather by bit error rates of "above average" pages or even best available pages. However, since short I/O sequences are uncommon in many applications, the overall reliability may hardly be affected by their occurrence even without special handling of short I/O sequences.

Special handling of short sequences e.g. as described above may involve modification of the control of the NAND Flash interface to enable both short "logical pages" and long ones to be sent. Furthermore, the memory management typically is modified to map pages of the size of the physical pages and not of the "logical" pages such that the NAND controller is able to take note of whether these pages were already written to the Flash device or not. In addition the NAND controller mapper is typically able to distinguish between pages that were programmed using a short sequence and those programmed using a long sequence, e.g. using a suitable table such as that shown in FIG. 11. In the table of FIG. 11, the page usage vector pertains to physical page size and not logical pages. Also stored is a short/long vector which identifies pages that were programmed as part of short sequences as well as pages programmed as part of long sequences. This is typically useful when the information is read from the device.

Figure 12:
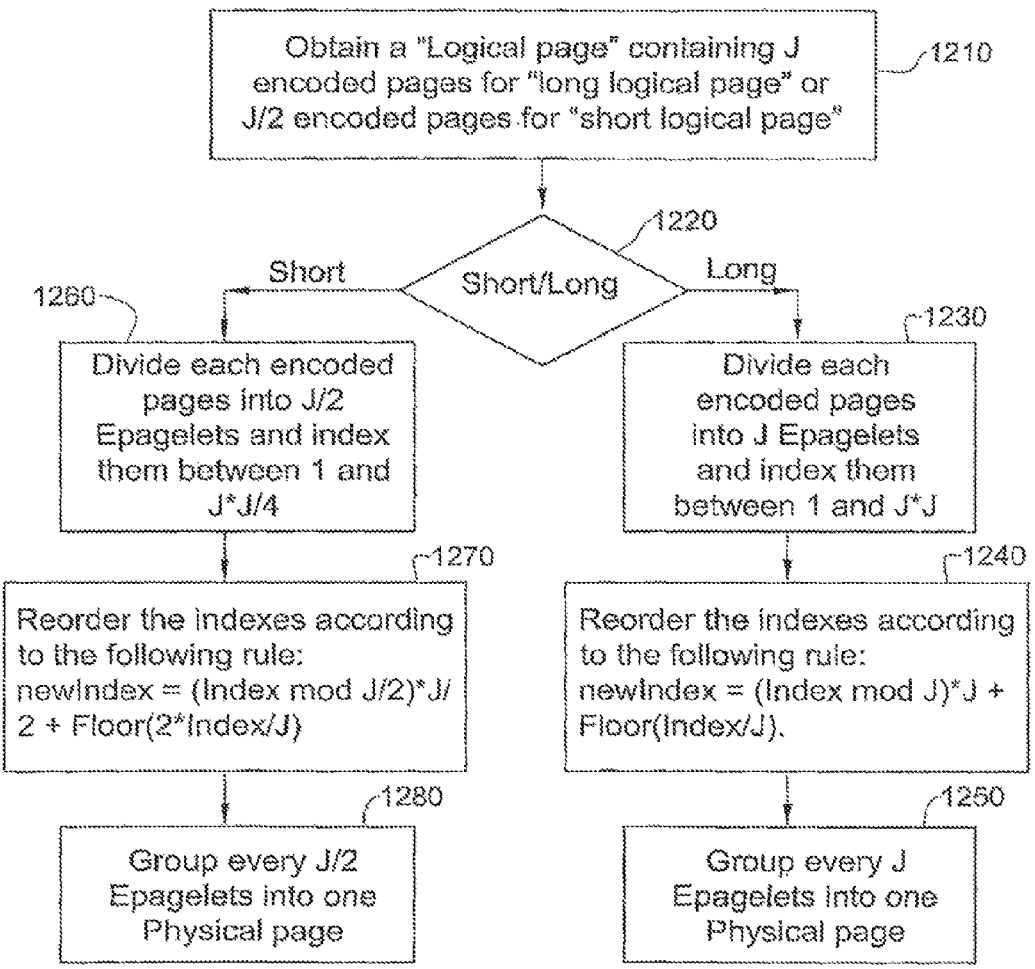

FIG. 12 illustrates a method for distributing pagelets into physical pages when the long sequences contain J encoded pages and the short ones contain J/2 pages. The pages are distributed into addresses as before, e.g. in the page multiplexer, by translating the address given by the controller as follows:

Physical Block Address=floor(Logical page address/M)

i=Logical Address within a block=Logical page address mod M

Physical Page Address within a page=foor(i/J)+{2 MJii=0 J/2−12 MJ (i−J/2)+MJi=J/2 J−1 ##EQU00001##

Figure 6A:
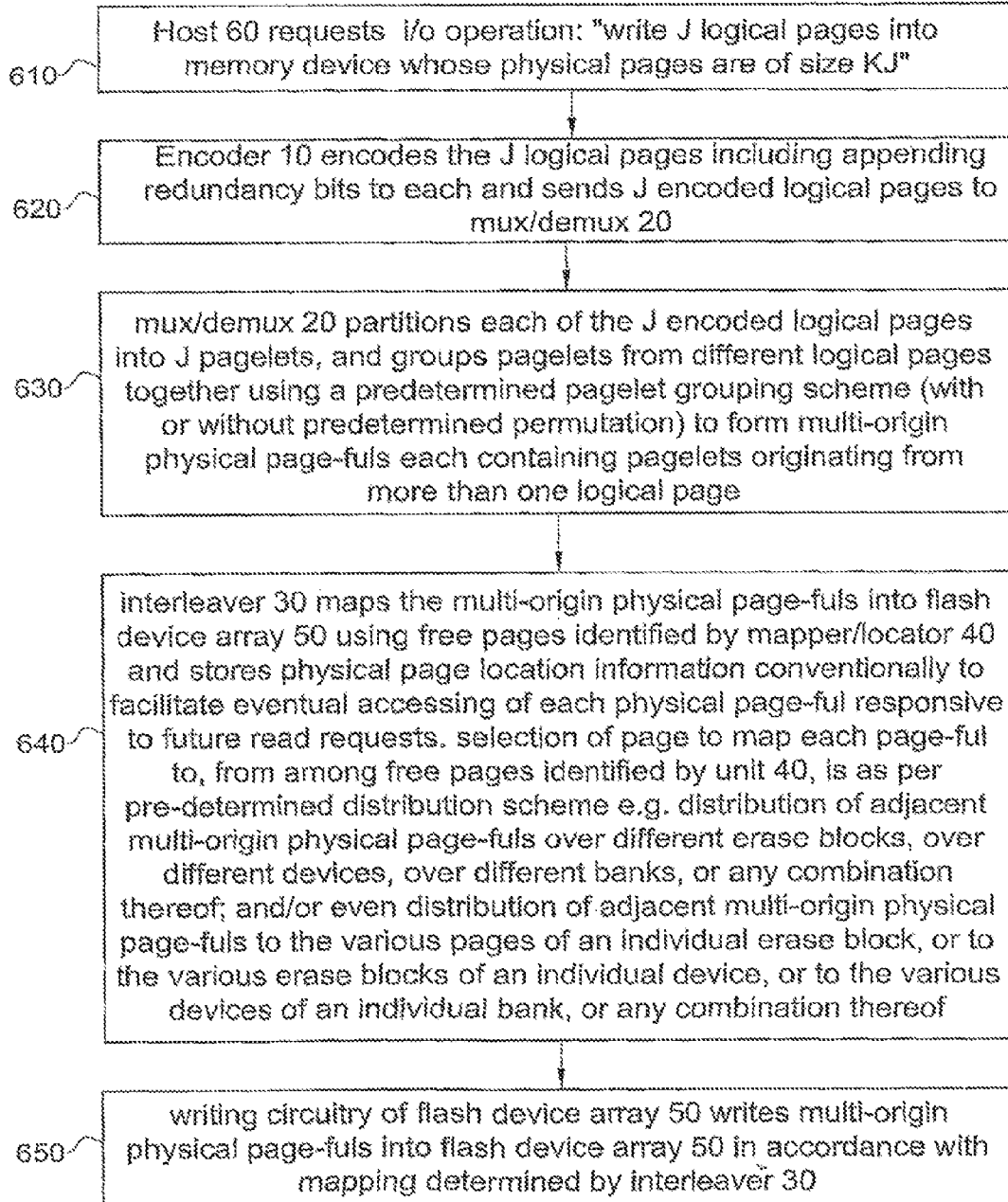
FIG. 6A is a simplified flowchart illustration of a method for writing on a flash memory device of uneven quality, using the system of FIG. 1A for distributing logical pages evenly within the flash device memory, wherein the demux/mux and interleaver of FIG. 1A are each operative in accordance with certain embodiments of the present invention.

FIG. 6A is a simplified flowchart illustration of a method for writing on the flash memory device of FIG. 1A, in accordance with certain embodiments of the present invention. In step 610, host 60 requests i/o operation: "write J logical pages into memory device whose physical pages are of size KJ". In step 620, encoder 10 encodes the J logical pages including appending redundancy bits to each and sends J encoded logical pages to mux/demux 20. In step 630, mux/demux 20 partitions each of the J encoded logical pages into J pagelets, and groups pagelets from different logical pages together using a predetermined pagelet grouping scheme (with or without predetermined permutation) to form multi-origin physical page-fuls each containing pagelets originating from more than one logical page.

In step 640, interleaves 30 maps the multi-origin physical page-fuls into flash device array 50 using free pages identified by mapper/locator 40 and stores physical page location information conventionally to facilitate eventual accessing of each physical page-ful responsive to future read requests. Selection of page to map each page-ful to, from among free pages identified by unit 40, is as per pre-determined distribution scheme e.g. distribution of adjacent multi-origin physical page-fuls over different erase blocks, over different devices, over different banks, or any combination thereof; and/or even distribution of adjacent multi-origin physical page-fuls to the various pages of an individual erase block, or to the various erase blocks of an individual device, or to the various devices of an individual bank, or any combination thereof. In step 650, writing circuitry of flash device array 50 writes multi-origin physical page-full into flash device array 50 in accordance with mapping determined by interleaver 30.

A particular advantage of certain embodiments of the method of FIG. 6A is that individual logical pages are less closely associated with specific low-quality local portions of the flash memory.

Figure 6B:
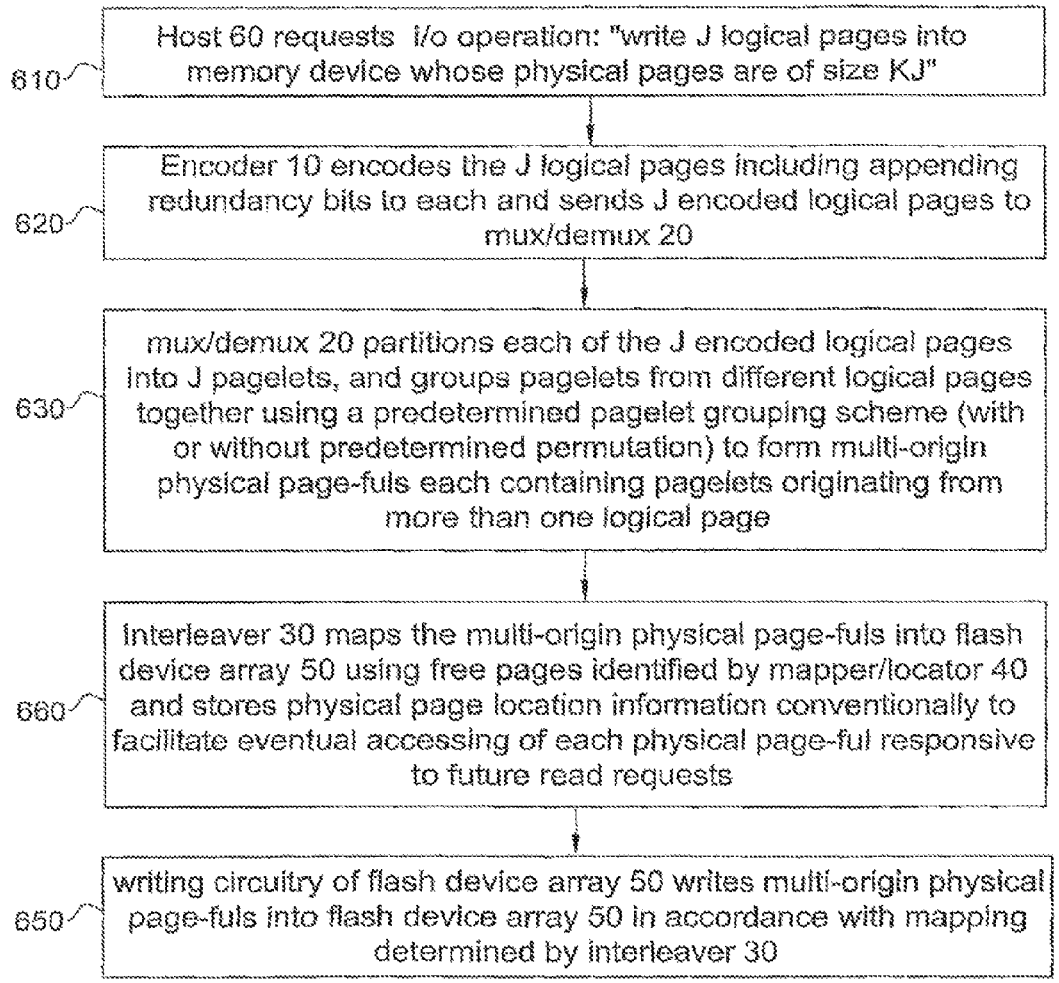
FIG. 6B is a simplified flowchart illustration of a method for writing on a flash memory device of uneven quality, using the system of FIG. 1A for distributing logical pages evenly within the flash device memory, wherein the demux/mux of FIG. 1A is operative in accordance with certain embodiments of the present invention.
Figure 6C:
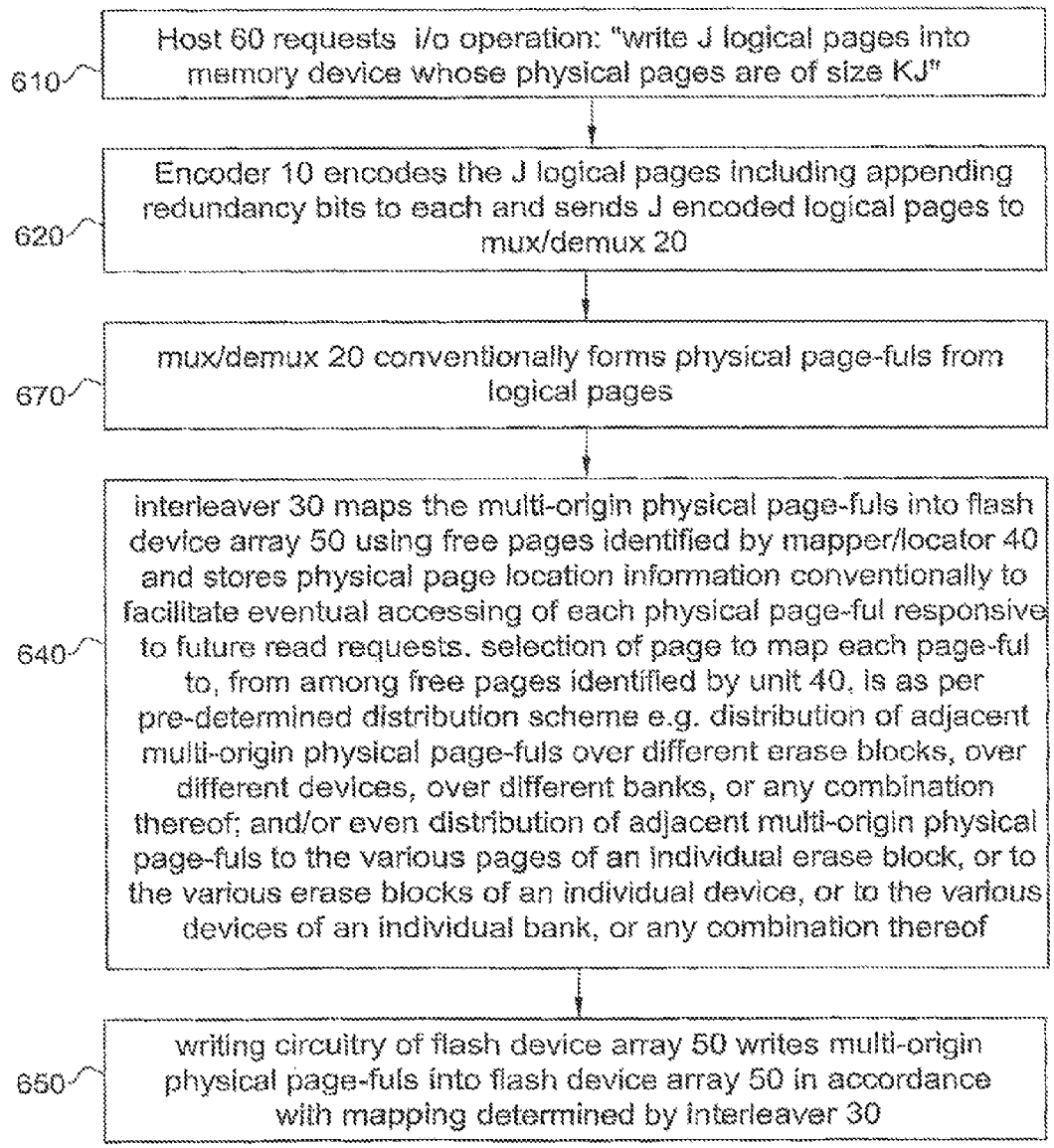
FIG. 6C is a simplified flowchart illustration of a method for writing on a flash memory device of uneven quality, using the system of FIG. 1A for distributing logical pages evenly within the flash device memory, wherein the interleaver of FIG. 1A is operative in accordance with certain embodiments of the present invention.

FIG. 6B is a simplified flowchart illustration of a method for writing on a flash memory device of uneven quality, using the system of FIG. 1A for distributing logical pages evenly within the flash device memory, wherein the demux/mux of FIG. 1A is operative in accordance with certain embodiments of the present invention. FIG. 6B is similar to FIG. 6A except that conventional step 660 replaces step 640 of FIG. 6A which is an inventive step. FIG. 6C is a simplified flowchart illustration of a method for writing on a flash memory device of uneven quality, using the system of FIG. 1A for distributing logical pages evenly within the flash device memory, wherein the interleaver of FIG. 1A is operative in accordance with certain embodiments of the present invention. FIG. 6C is similar to FIG. 6A except that step 670 replaces step 630 of FIG. 6A.

Figure 7:
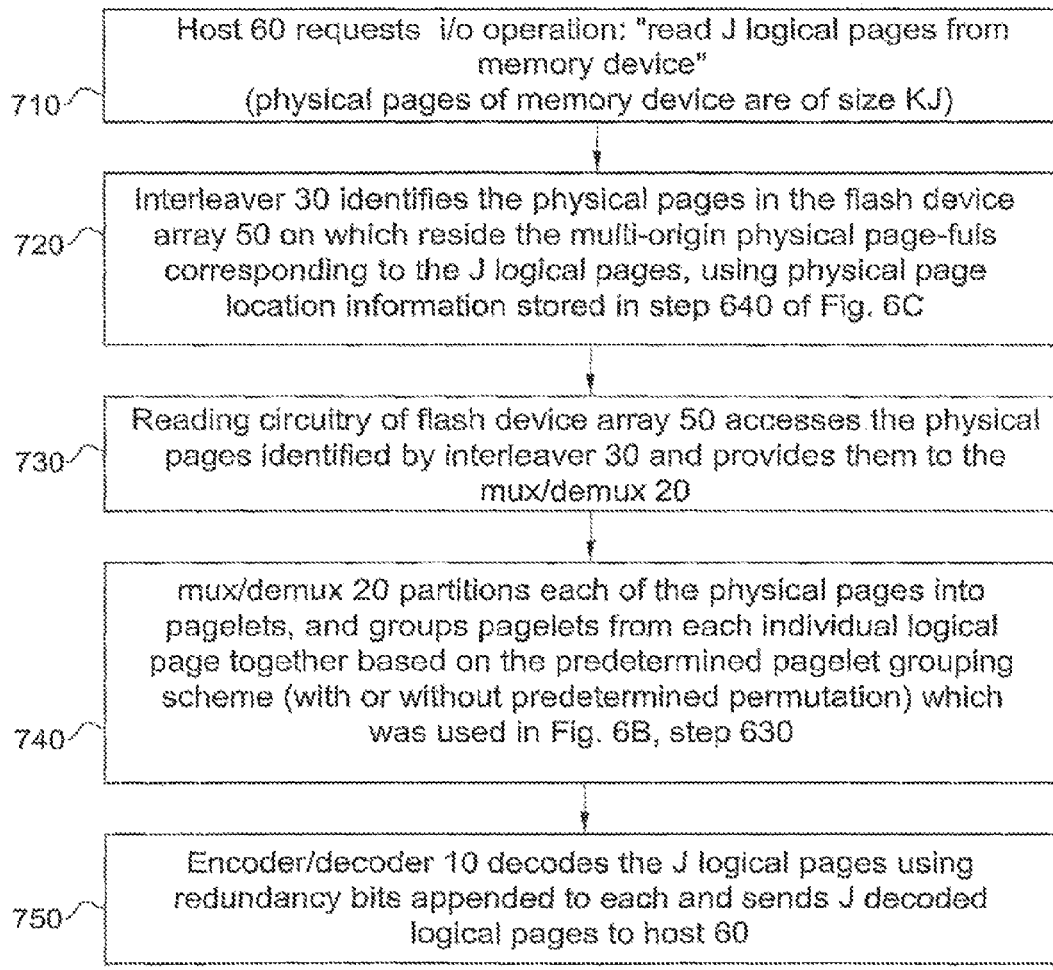
FIG. 7 is a simplified flowchart illustration of a method for reading from a flash memory device of uneven quality, in which the system of FIG. 1A has distributed logical pages evenly, in accordance with certain embodiments of the present invention.

FIG. 7 is a simplified flowchart illustration of a method for reading from the flash memory device of FIG. 1A, in accordance with certain embodiments of the present invention. In step 710, host 60 requests i/o operation: "read J logical pages from memory device" (physical pages of memory device are of size KJ). In step 720, interleaver 30 identifies the physical pages in the flash device array 50 on which reside the multi-origin physical page-fuls corresponding to the J logical pages, using physical page location information stored in step 640 of FIG. 6. In step 730, reading circuitry of flash device array 50 accesses the physical pages identified by interleaver 30 and provides them to the mux/demux 20.

In step 740, mux/demux 20 partitions each of the physical pages into pagelets, and groups pagelets from each individual logical page together based on the predetermined pagelet grouping scheme (with or without predetermined permutation) which was used in FIG. 6, step 630. In step 750, encoder/decoder 10 decodes the J logical pages using redundancy bits appended to each and sends J decoded logical pages to host 60.

Included in the scope of the present invention, inter alia, are electromagnetic signals carrying computer-readable instructions for performing any or all of the steps of any of the methods shown and described herein, in any suitable order; machine-readable instructions for performing any or all of the steps of any of the methods shown and described herein, in any suitable order; program storage devices readable by machine, tangibly embodying a program of instructions executable by the machine to perform any or all of the steps of any of the methods shown and described herein, in any suitable order; a computer program product comprising a computer useable medium having computer readable program code having embodied therein, and/or including computer readable program code for performing, any or all of the steps of any of the methods shown and described herein, in any suitable order; any technical effects brought about by any or all of the steps of any of the methods shown and described herein, when performed in any suitable order; any suitable apparatus or device or combination of such, programmed to perform, alone or in combination, any or all of the steps of any of the methods shown and described herein, in any suitable order; information storage devices or physical records, such as disks or hard drives, causing a computer or other device to be configured so as to carry out any or all of the steps of any of the methods shown and described herein, in any suitable order; a program pre-stored e.g. in memory or on an information network such as the Internet, before or after being downloaded, which embodies any or all of the steps of any of the methods shown and described herein, in any suitable order, and the method of uploading or downloading such, and a system including server/s and/or client/s for using such; and hardware which performs any or all of the steps of any of the methods shown and described herein, in any suitable order, either alone or in conjunction with software.

Certain operations are described herein as occurring in the microcontroller internal to a flash memory device. Such description is intended to include operations which may be performed by hardware which may be associated with the microcontroller such as peripheral hardware on a chip on which the microcontroller may reside. It is also appreciated that some or all of these operations, in any embodiment, may alternatively be performed by the external, host-flash memory device interface controller including operations which may be performed by hardware which may be associated with the interface controller such as peripheral hardware on a chip on which the interface controller may reside. Finally it is appreciated that the internal and external controllers may each physically reside on a single hardware device, or alternatively on several operatively associated hardware devices.

Any data described as being stored at a specific location in memory may alternatively be stored elsewhere, in conjunction with an indication of the location in memory with which the data is associated. For example, instead of storing page- or erase-sector-specific information within a specific page or erase sector, the same may be stored within the flash memory device's internal microcontroller or within a microcontroller interfacing between the flash memory device and the host, and an indication may be stored of the specific page or erase sector associated with the cells.

It is appreciated that the teachings of the present invention can, for example, be implemented by suitably modifying, or interfacing externally with, flash controlling apparatus. The flash controlling apparatus controls a flash memory array and may comprise either a controller external to the flash array or a microcontroller on-board the flash array or otherwise incorporated therewithin. Examples of flash memory arrays include Samsung's K9XXG08UXM series, Hynix's HY27UK08BGFM Series, Micron's MT29F64G08TAAWP or other arrays such as but not limited to NOR or phase change memory. Examples of controllers which are external to the flash array they control include STMicroelectrocincs's ST7265x microcontroller family, STMicroelectrocincs's ST72681 microcontroller, and SMSC's USB97C242, Traspan Technologies' TS-4811, Chipsbank CBM2090/CBM1190. Example of commercial IP software for Flash file systems are: Denali's Spectra™ NAND Flash File System, Aarsan's NAND Flash Controller IP Core and Arasan's NAND Flash File System. It is appreciated that the flash controller apparatus need not be NAND-type and can alternatively, for example, be NOR-type or phase change memory-type.

Flash controlling apparatus, whether external or internal to the controlled flash array, typically includes the following components: a Memory Management/File system, a NAND interface (or other flash memory array interface), a Host Interface (USB, SD or other), error correction circuitry (ECC) typically comprising an Encoder and matching decoder, and a control system managing all of the above.

The present invention may for example interface with or modify, as per any of the embodiments described herein, one, some or all of the above components and particularly the NAND interface component and, in some embodiments, with the memory management component.

It is appreciated that software components of the present invention including programs and data may, if desired, be implemented in ROM (read only memory) form including CD-ROMs, EPROMs and EEPROMs, or may be stored in any other suitable computer-readable medium such as but not limited to disks of various kinds, cards of various kinds and RAMs. Components described herein as software may, alternatively, be implemented wholly or partly in hardware, if desired, using conventional techniques.

Features of the present invention which are described in the context of separate embodiments may also be provided in combination in a single embodiment. Conversely, features of the invention which are described for brevity in the context of a single embodiment may be provided separately or in any suitable subcombination.

I claim:

1. A flash memory accessory device operative in conjunction with a data source supplying a stream of logical pages including data and a flash memory system including a multiplicity of physical pages, the flash memory accessory device comprising:
    a page multiplexer and interleaver for:
        (a) receiving multiple (J) encoded logical pages;
        (b) breaking down each encoded logical page into multiple (J) logical pagelets;
        (c) for each value of index i that ranges between 1 and J and for each value of index j that ranges between 1 and J, ordering an [(i+j−2 moduloJ)+1]'th pagelet of an j'th logical page to an i'th pagelet of a j'th physical page of the multiplicity of physical pages.

2. A method for facilitating interaction between a data source supplying a stream of logical pages including data and a flash memory system including a multiplicity of physical pages, the method comprising:
    receiving multiple (J) encoded logical pages;
    breaking down each encoded logical page into multiple (J) logical pagelets;
    ordering, for each value of index i that ranges between 1 and J and for each value of index j that ranges between 1 and J, an [(i+j−2 moduloJ)+1]'th pagelet of an j'th logical page to an i'th pagelet of a j'th physical page of the multiplicity of physical pages.

3. A non-transitory computer useable medium having computer readable program code embodied for: facilitating interaction between a data source supplying a stream of logical pages including data and a flash memory system including a multiplicity of physical pages, by:
    receiving multiple (J) encoded logical pages;
    breaking down each encoded logical page into multiple (J) logical pagelets;
    ordering, for each value of index i that ranges between 1 and J and for each value of index j that ranges between 1 and J, an [(i+j−2 moduloJ)+1]'th pagelet of an j'th logical page to an i'th pagelet of a j'th physical page of the multiplicity of physical pages.

* * * * *